(12) United States Patent
You

(10) Patent No.: US 12,144,211 B2
(45) Date of Patent: Nov. 12, 2024

(54) DISPLAY APPARATUS INCLUDING METAL PATTERN OVERLAPPING WITH CONDUCTIVE LINE AT BENDING AREA AND METHOD OF MANUFACTURING THE SAME

(71) Applicant: Samsung Display Co., Ltd., Yongin-si (KR)

(72) Inventor: Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 170 days.

(21) Appl. No.: 17/123,706

(22) Filed: Dec. 16, 2020

(65) Prior Publication Data

US 2022/0020838 A1     Jan. 20, 2022

(30) Foreign Application Priority Data

Jul. 17, 2020  (KR) ......................... 10-2020-0089157

(51) Int. Cl.
*H10K 59/131* (2023.01)
*H10K 50/84* (2023.01)
*H10K 59/12* (2023.01)
*H10K 59/122* (2023.01)
*H10K 59/124* (2023.01)
(Continued)

(52) U.S. Cl.
CPC ........... *H10K 59/131* (2023.02); *H10K 50/84* (2023.02); *H10K 59/122* (2023.02); *H10K 59/124* (2023.02); *H10K 59/40* (2023.02); *H10K 71/00* (2023.02); *H10K 59/1201* (2023.02)

(58) Field of Classification Search
CPC .............. H01L 27/3276; H01L 27/323; H01L 27/3246; H01L 27/3258; H01L 51/5237; H01L 51/56; H01L 2227/323; H10K 50/844; H10K 59/122; H10K 59/124; H10K 59/1201; H10K 59/40; H10K 71/00; H10K 71/851; G06F 3/0412
USPC ...................................................... 257/40, 59
See application file for complete search history.

(56) References Cited

U.S. PATENT DOCUMENTS 9,974,482 B2     5/2018  Shim et al.
10,446,636 B2   10/2019  Lee et al.
2017/0277288 A1*  9/2017  Choi ................... H10K 50/844
(Continued)

FOREIGN PATENT DOCUMENTS

KR     10-2017-0049280 A    5/2017
KR     10-2018-0042504 A    4/2018
(Continued)

*Primary Examiner* — Nduka E Ojeh
*Assistant Examiner* — Eric W Jones
(74) *Attorney, Agent, or Firm* — Lewis Roca Rothgerber Christie LLP

(57) ABSTRACT

A display apparatus includes: a substrate including a display area, a peripheral area, a pad area, and a bending area, the peripheral area being outside the display area, the pad area being within the peripheral area, and the bending area being between the display area and the pad area; a first organic insulating layer at the bending area; a first conductive line on the first organic insulating layer; a second organic insulating layer on the first conductive line; a third organic insulating layer on the second organic insulating layer; and a metal pattern on the third organic insulating layer, and overlapping with at least a portion of the first conductive line.

20 Claims, 25 Drawing Sheets

(51) Int. Cl.
*H10K 59/40* (2023.01)
*H10K 71/00* (2023.01)

(56) References Cited

U.S. PATENT DOCUMENTS

| | | | |
|---|---|---|---|
| 2018/0040672 A1* | 2/2018 | Park | H01L 27/3223 |
| 2018/0081219 A1* | 3/2018 | Kim | G06F 1/1652 |
| 2018/0145125 A1* | 5/2018 | Lee | H01L 51/0097 |
| 2018/0366586 A1* | 12/2018 | Son | H01L 51/0097 |
| 2019/0096975 A1* | 3/2019 | Park | H01L 27/3276 |
| 2019/0326361 A1 | 10/2019 | Gwon et al. | |
| 2019/0326383 A1* | 10/2019 | Yamanaka | G09F 9/30 |
| 2020/0035762 A1 | 1/2020 | Kim et al. | |
| 2020/0066821 A1* | 2/2020 | Saitoh | H05B 33/10 |

FOREIGN PATENT DOCUMENTS

| | | |
|---|---|---|
| KR | 10-2019-0121532 A | 10/2019 |
| KR | 10-2020-0012067 A | 2/2020 |
| KR | 10-2076838 B1 | 2/2020 |

* cited by examiner

DISPLAY APPARATUS INCLUDING METAL PATTERN OVERLAPPING WITH CONDUCTIVE LINE AT BENDING AREA AND METHOD OF MANUFACTURING THE SAME

CROSS-REFERENCE TO RELATED APPLICATION

This application claims priority to and the benefit of Korean Patent Application No. 10-2020-0089157, filed on Jul. 17, 2020, in the Korean Intellectual Property Office, the disclosure of which is incorporated by reference herein in its entirety.

BACKGROUND

1. Field

Aspects of one or more embodiments relate to a display apparatus and a method of manufacturing the same, and more particularly, to a display apparatus with an improved product reliability and a method of manufacturing the same.

2. Description of Related Art

Among display apparatuses, an organic light-emitting display apparatus may have wide viewing angles, excellent contrast, and fast response speeds, and thus, the organic light-emitting display apparatus is in the limelight as a next-generation display apparatus.

Generally, an organic light-emitting display apparatus includes a thin-film transistor and organic light-emitting diodes over a substrate, and the organic light-emitting diodes emit light. Organic light-emitting display apparatuses may be used as display units of small or miniaturized products, for example, such as mobile phones, and/or may be used as display units of large-scale products, for example, such as televisions.

A display apparatus, such as the organic light-emitting display apparatus, includes a display unit arranged over a substrate, and a fan-out unit in which wirings extend to one side of the display unit. In the display apparatus, visibility at various angles may be improved or the area of a peripheral area may be reduced by bending at least a portion of the display apparatus.

The above information disclosed in this Background section is for enhancement of understanding of the background of the present disclosure, and therefore, it may contain information that does not constitute prior art.

SUMMARY

In a display apparatus, a bending area may crack, and thus, wirings arranged at (e.g., in or on) the bending area may be damaged.

One or more embodiments of the present disclosure are directed to a display apparatus and a method of manufacturing the same, in which cracks in a bending area may be reduced or prevented, and thus, damage to wirings arranged at (e.g., in or on) the bending area may be reduced or prevented. However, it should be understood that the example embodiments described herein should be considered in a descriptive sense and not for limitation of the present disclosure.

Additional aspects will be set forth in part in the description which follows and, in part, will be apparent from the description, or may be learned by practicing one or more of the presented embodiments of the present disclosure.

According to one or more example embodiments of the present disclosure, a display apparatus includes: a substrate including a display area, a peripheral area, a pad area, and a bending area, the peripheral area being outside the display area, the pad area being within the peripheral area, and the bending area being between the display area and the pad area; a first organic insulating layer at the bending area; a first conductive line on the first organic insulating layer; a second organic insulating layer on the first conductive line; a third organic insulating layer on the second organic insulating layer; and a metal pattern on the third organic insulating layer, and overlapping with at least a portion of the first conductive line.

In an example embodiment, the metal pattern may be directly on the third organic insulating layer.

In an example embodiment, the metal pattern may be electrically floated.

In an example embodiment, the metal pattern may include: a first metal layer on the third organic insulating layer; and a second metal layer on the first metal layer.

In an example embodiment, the first metal layer may include a material different from that of the second metal layer.

In an example embodiment, the display apparatus may further include a third metal layer on the second metal layer, and the second metal layer may include a material different from that of the third metal layer.

In an example embodiment, the display apparatus may further include a bending protection layer on the metal pattern.

In an example embodiment, the display apparatus may further include: a thin-film transistor at the display area; and a display element electrically connected to the thin-film transistor. The thin-film transistor may be electrically connected to the display element through a connection electrode.

In an example embodiment, the connection electrode may include the same material as that of the first conductive line.

In an example embodiment, the display apparatus may further include: a second conductive line at the peripheral area; and a third conductive line at the pad area. The first conductive line may be electrically connected to the second conductive line and the third conductive line.

In an example embodiment, the first conductive line may be at a layer different from those of the second conductive line and the third conductive line.

In an example embodiment, the second conductive line and the third conductive line may each have a bent shape in a plan view.

In an example embodiment, the first conductive line may have a straight shape in a plan view.

In an example embodiment, the thin-film transistor may include: a gate electrode; a source electrode; and a drain electrode. The second conductive line and the third conductive line may each include the same material as that of the gate electrode.

In an example embodiment, display apparatus may further include a first planarization layer covering the source electrode and the drain electrode, and the first organic insulating layer may include the same material as that of the first planarization layer.

In an example embodiment, display apparatus may further include a second planarization layer on the first planarization layer, and the second organic insulating layer may include the same material as that of the second planarization layer.

In an example embodiment, display apparatus may further include: a pixel electrode on the second planarization layer; and a pixel-defining layer exposing at least a portion of the pixel electrode. The third organic insulating layer may include the same material as that of the pixel-defining layer.

In an example embodiment, the display apparatus may further include: an encapsulation layer covering the display element; and a sensor electrode layer on the encapsulation layer.

In an example embodiment, the sensor electrode layer may include: a first sensor electrode; and a second sensor electrode on the first sensor electrode. The metal pattern may include the same material as that of the second sensor electrode.

In an example embodiment, the display apparatus may further include: an insulating layer over the substrate, and the insulating layer may have an opening corresponding to the bending area.

In an example embodiment, the first organic insulating layer may be inside the opening.

According to one or more example embodiments of the present disclosure, a method of manufacturing a display apparatus, includes: preparing a substrate including a display area, a peripheral area, a pad area, and a bending area, the peripheral area being outside the display area, the pad area being within the peripheral area, and the bending area being between the display area and the pad area; forming a connection electrode at the display area; forming a first conductive line at the bending area; forming a first sensor electrode on the connection electrode; forming a metal material layer on the first sensor electrode and the first conductive line; and patterning the metal material layer to form a second sensor electrode on the first sensor electrode, and to form a metal pattern on the first conductive line.

In an example embodiment, the metal pattern may overlap with at least a portion of the first conductive line.

In an example embodiment, the metal pattern may include the same material as that of the second sensor electrode.

In an example embodiment, the metal pattern may include: a first metal layer; and a second metal layer, and the first metal layer may include a material different from that of the second metal layer.

In an example embodiment, the metal pattern may further include a third metal layer on the second metal layer, and the second metal layer may include a material different from that of the third metal layer.

In an example embodiment, the connection electrode may include the same material as that of the first conductive line.

In an example embodiment, before the forming of the connection electrode at the display area and the forming of the first conductive line at the bending area, the method may further include: forming a thin-film transistor at the display area; forming a second conductive line at the peripheral area; and forming a third conductive line at the pad area. The thin-film transistor may include a gate electrode, a source electrode, and a drain electrode.

In an example embodiment, the second conductive line and the third conductive line may include the same material as that of the source electrode and the drain electrode.

In an example embodiment, the method may further include forming a bending protection layer on the metal pattern.

The above and/or other aspects and features of the present disclosure may become apparent and more readily appreciated from the following description of the example embodiments, the accompanying drawings, and the claims.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
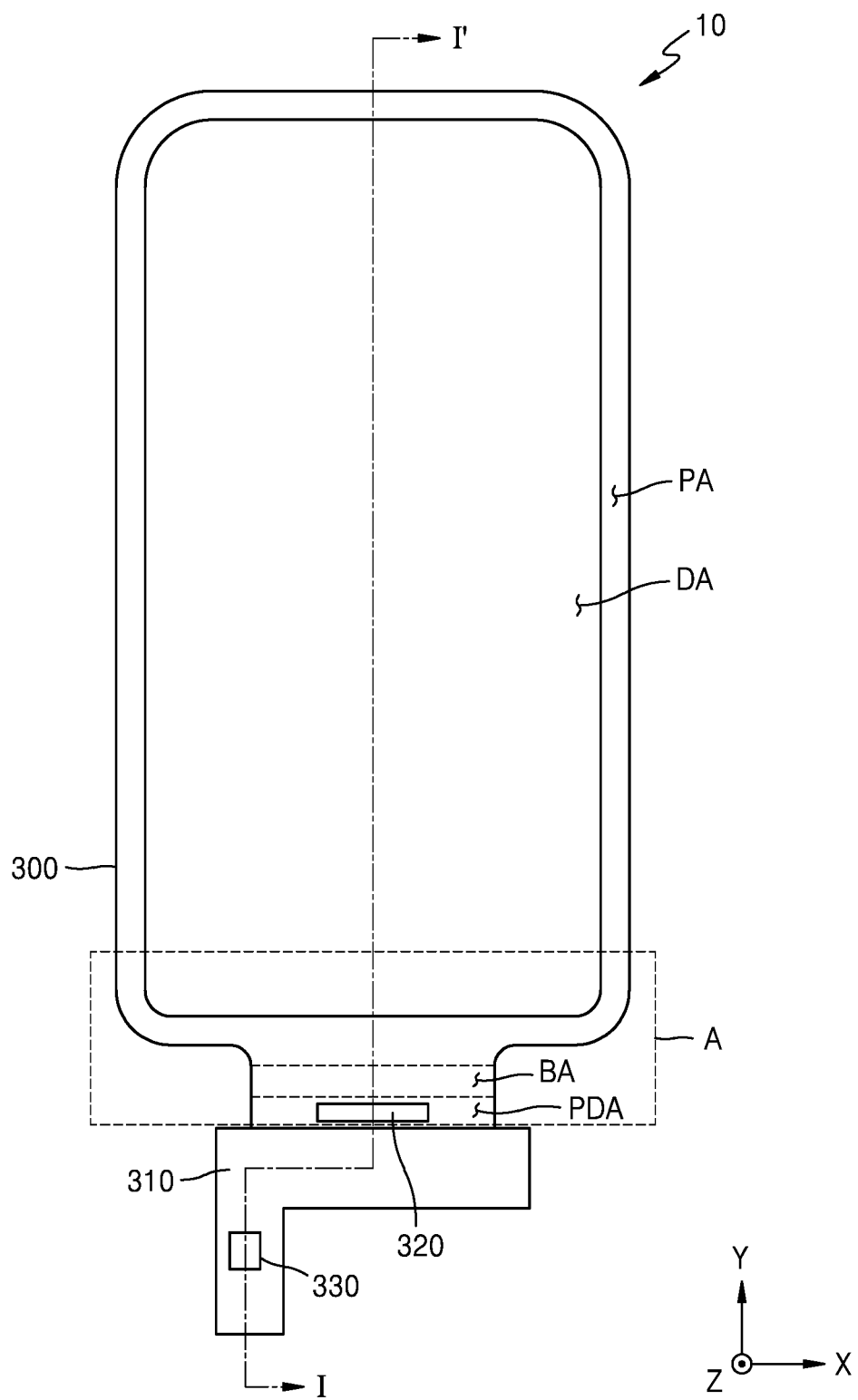
FIG. 1 is a plan view of a portion of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, it will be understood that when a layer, region, or element is referred to as being "formed on" another layer, area, or element, it can be directly or indirectly formed on the other layer, region, or element. That is, for example, intervening layers, regions, or elements may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" may include A or B, or A and B. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

As used herein, when a wiring is referred to as "extending in a first direction or a second direction", the wiring may extend in a straight line shape or may extend in a zigzag or a curve shape in the first direction and/or the second direction. As used herein, "a plan view" or "on a plan view" may refer to an objective portion that is viewed from above, and "a cross-sectional view" or "on a cross-sectional view" may refer to a cross-section of an objective portion taken vertically that is viewed from a lateral side. As used herein, "overlapping" includes overlapping "in a plan view" and/or overlapping "in a cross-sectional view."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
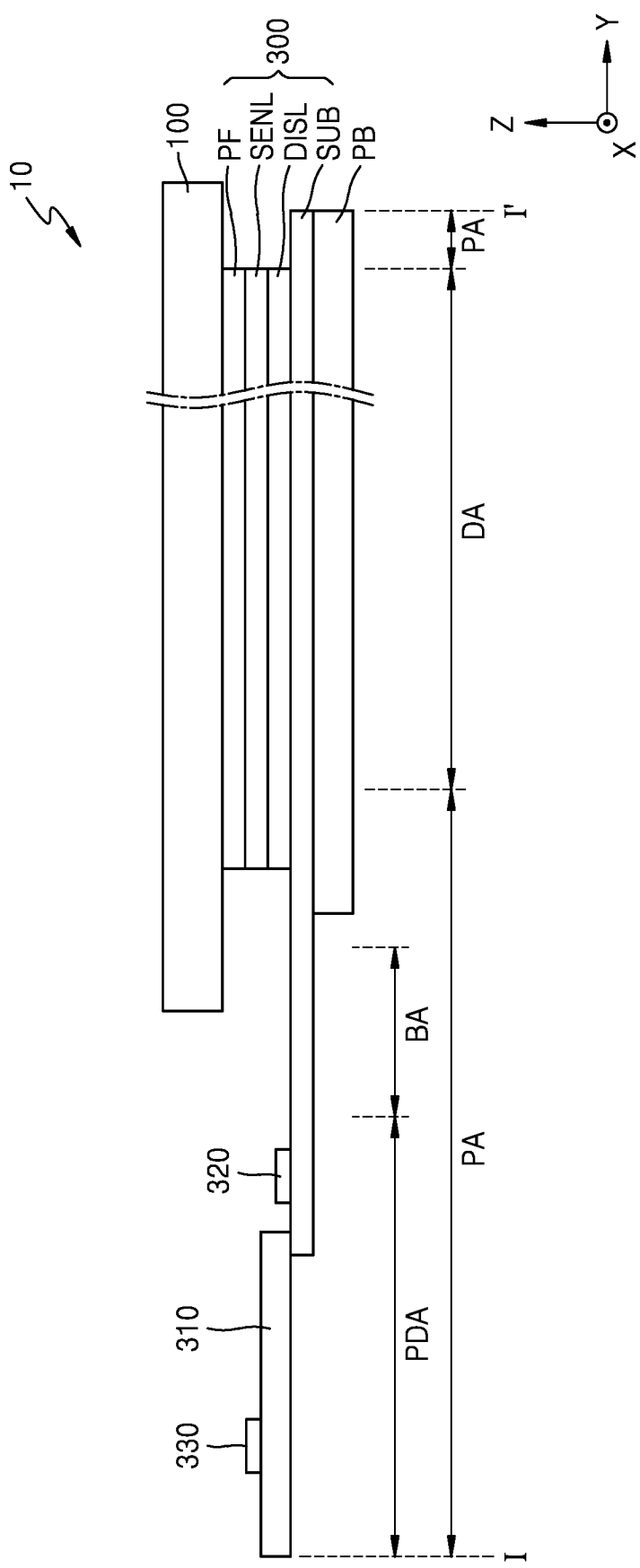
FIG. 2 is a cross-sectional view of a portion of a display apparatus according to an embodiment.
Figure 3:
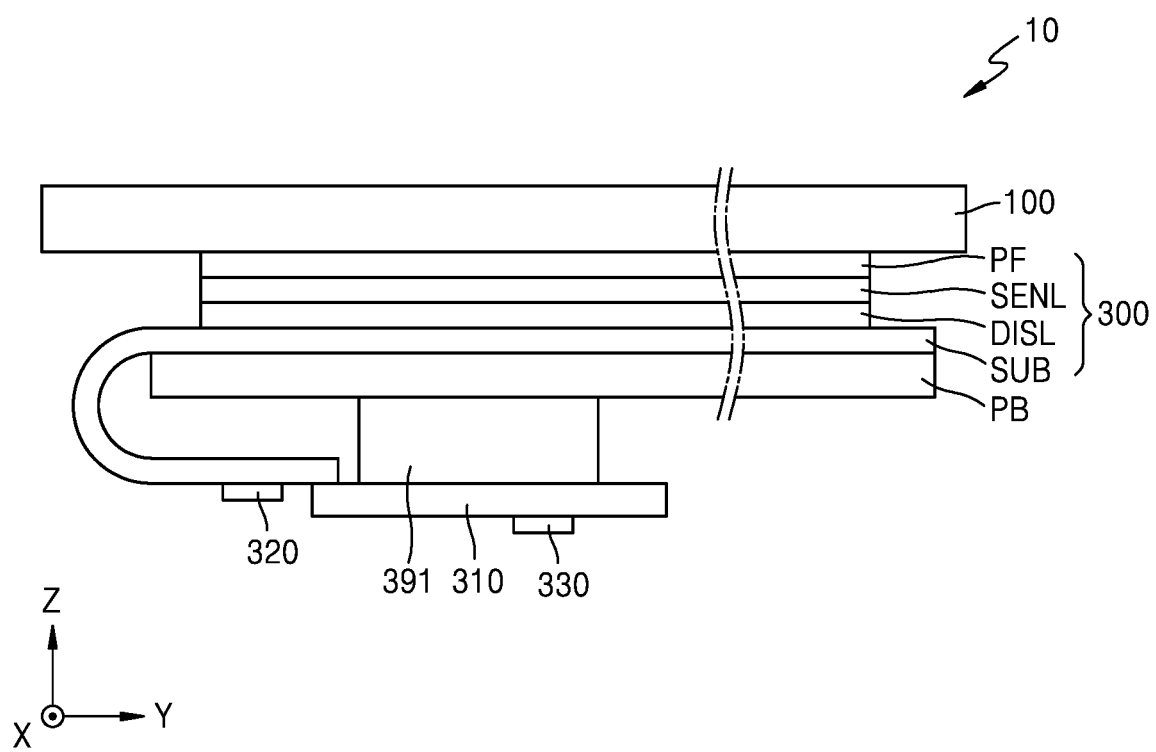
FIG. 3 is a cross-sectional view of the display apparatus of FIG. 2 in a bent state.

FIG. 1 is a plan view of a portion of a display apparatus 10 according to an embodiment, FIG. 2 is a cross-sectional view of a portion of the display apparatus 10 according to an embodiment, and FIG. 3 is a cross-sectional view of the display apparatus 10 of FIG. 2 in a bent state. For example, FIG. 2 is a cross-sectional view taken along the line I-I' of FIG. 1.

Referring to FIGS. 1 to 3, the display apparatus 10 may include an apparatus for displaying moving images and/or still images, and may be used as a display screen of various suitable products including, for example, televisions, notebook computers, monitors, advertisement boards, Internet of things (IOT) devices, and/or the like, as well as a display screen of various suitable portable electronic apparatuses including, for example, mobile phones, smart phones, tablet personal computers (PC), mobile communication terminals, electronic organizers, electronic books, portable multimedia players (PMP), navigation devices, ultra mobile personal computers (UMPC), and/or the like. In addition, the display apparatus 10 may be used in wearable devices including, for example, smartwatches, watchphones, glasses-type displays, head-mounted displays (HMD), and/or the like. Further, the display apparatus 10 may be used as instrument panels for automobiles, center fascias for automobiles, center information displays (CID) arranged on a dashboard, room mirror displays that replace side mirrors of automobiles, displays arranged on the backside of the front seats of automobiles for entertainment for the back seats of automobiles, and/or the like.

For convenience, FIGS. 1 to 3 show that the display apparatus 10 according to the present embodiment is used as a smartphone, but the present disclosure is not limited thereto. The display apparatus 10 according to the present embodiment includes a cover window 100, a display panel 300, a display circuit board 310, a display driver 320, a sensor driver 330, and a panel bottom cover PB. In addition, in some embodiments, the display apparatus 10 may further include a bracket, a main circuit board, a battery, and a bottom cover.

Hereinafter, a "top portion" refers to a direction (e.g., a (+) Z-direction) in which the cover window 100 is arranged with respect to the display panel 300, and a "bottom portion" refers to an opposite direction (e.g., a (−) Z-direction) with respect to the display panel 300. In addition, "left" and "right" denote directions when the display panel 300 is viewed in a direction perpendicular to or substantially perpendicular to (e.g., a top surface of) the display panel 300. For example, "left" may refer to a (−) X-direction, and "right" may refer to a (+) X-direction.

The display apparatus 10 may have a rectangular or substantially rectangular shape (e.g., may approximately have a rectangular shape) as shown in FIG. 1 in a view (e.g., a plan view) in a direction (e.g., a Z-axis direction) perpendicular to or substantially perpendicular to a surface thereof. As an example, as shown in FIG. 1, the display apparatus 10 may have a planar rectangular shape as a whole having short sides extending in a first direction (e.g., an X-axis direction), and long sides extending in a second direction (e.g., a Y-axis direction). A corner where a short side in the first direction and a long side in the second direction meet each other may have a rounded shape having a suitable curvature (e.g., a preset curvature), or may have a right angle shape. However, the present disclosure is not limited thereto, and planar shape of the display apparatus 10 is not limited to a rectangular shape, and may be any other suitable shape, for example another polygon shape, a circle shape, an ellipse shape, or the like.

As shown in FIGS. 2 and 3, the cover window 100 may be arranged on the display panel 300 to cover the top surface of the display panel 300. The cover window 100 may protect the top surface of the display panel 300.

The display panel 300 may be arranged under the cover window 100. The display panel 300 may overlap with a transmission portion of the cover window 100. The display panel 300 may include a substrate SUB, and display elements arranged over the substrate SUB. For example, as shown in FIGS. 2 and 3, the display panel 300 includes the substrate SUB, a display layer DISL, a sensor electrode layer SENL, and a polarizing film PF.

The display panel 300 displays (e.g., outputs) information processed by the display apparatus 10. As an example, the display panel 300 may display execution screen information of an application driven by the display apparatus 10, or user interface (UI) information or graphical user interface (GUI) information corresponding to the execution screen information. The display panel 300 may include the display layer DISL for displaying an image, and the sensor electrode layer SENL for sensing a user's touch input. Accordingly, the display panel 300 may serve as one of input units (e.g., as an input device) for providing an input interface between the display apparatus 10 and a user, and concurrently (e.g., simultaneously or at the same time), may serve as one of output units (e.g., as an output device) for providing an output interface between the display apparatus 10 and a user.

The substrate SUB of the display panel 300 may include an insulating material, for example, such as glass, quartz, or a polymer resin. The substrate SUB may include a rigid substrate or a flexible substrate that is bendable, foldable, and/or rollable. As shown in FIGS. 2 and 3, the substrate SUB may be a flexible substrate, and thus, the display panel 300 may have a bent shape in a bending area BA. Although it is shown in FIG. 3 that only the substrate SUB is bent, the present disclosure is not limited thereto. For example, in some embodiments, there may be at least a portion of the display layer DISL and/or at least a portion of the sensor electrode layer SENL at (e.g., in or on) the bending area BA and a pad area. In this case, the portion of the display layer DISL and/or the portion of the sensor electrode layer SENL may also be bent in the bending area BA.

The substrate SUB includes a display area DA, and a peripheral area PA outside the display area DA. Display elements are arranged at (e.g., in or on) the display area DA of the substrate SUB. The display layer DISL of FIGS. 2 and 3 may be a layer including the display elements arranged over the substrate SUB. In an embodiment, the display layer DISL may include a thin-film transistor layer, a display element layer, and an encapsulation layer. The thin-film transistor layer may include a plurality of thin-film transistors, the display element layer may include a plurality of display elements, for example, such as organic light-emitting diodes, and the encapsulation layer may encapsulate the display element layer.

The peripheral area PA of the substrate SUB may be a region in which an image is not displayed. The peripheral area PA may surround (e.g., around a periphery of) the display area DA. The peripheral area PA may be a region extending from the edge of the display area DA to the edge of the display panel 300. A plurality of pixels, and also scan lines, data lines, power lines, and the like connected to the pixels, may be arranged at (e.g., in or on) the display area DA. A scan driver, fan-out wirings, and the like may be arranged at (e.g., in or on) the peripheral area PA. The scan driver may apply scan signals to the scan lines, and the fan-out wirings may connect the data lines to the display driver 320.

The display elements may include, for example, light-emitting elements. In various embodiments, the display panel 300 may include (e.g., may be) an organic light-emitting display panel that uses an organic light-emitting diode including an emission layer, a micro light-emitting diode (micro LED) display panel that uses a micro LED, a quantum dot light-emitting display panel that uses a quantum dot light-emitting diode including a quantum dot emission layer, or an inorganic light-emitting display panel that uses an inorganic light-emitting diode including an inorganic semiconductor.

The sensor electrode layer SENL may sense a user's touch input by using at least one of various suitable touch methods including, for example, a resistive layer method, a capacitive method, and/or the like. As an example, in the case where the sensor electrode layer SENL senses a user's touch input through a capacitive method, the sensor driver 330 may be configured to determine whether a user applies a touch to the sensor electrode layer SENL by applying driving signals to driving electrodes from among sensor electrodes, and sensing voltages charged in a mutual capacitance between the driving electrodes and sensing electrodes from among the sensor electrodes through the sensing electrodes. The user's touch may include a contact touch and a proximity touch. The contact touch refers to a direct contact of a user's finger and/or an object, for example, such as a pen, on the cover window 100 arranged on the sensor electrode layer SENL. The proximity touch indicates that the user's finger and/or the object, for example, such as the pen, is closely located over the cover window 100 but is spaced apart from (e.g., not in contact with) the cover window 100, for example, such as hovering at a suitable distance over the cover window 100. The sensor driver 330 may transfer sensor data to a main processor according to the sensed voltages, and the main processor may calculate a touch coordinate where the touch input occurs by analyzing the sensor data.

The polarizing film PF may be arranged on the sensor electrode layer SENL. The polarizing film PF may include a linear polarizing plate and a phase delay film, for example, such as a quarter wave (λ/4) plate. The phase delay film may be arranged on the sensor electrode layer SENL, and the linear polarizing plate may be arranged on the phase delay film. In another embodiment, the polarizing film PF may be omitted, or may be embedded in the display layer DISL or the sensor electrode layer SENL.

The display panel 300 may include a rigid display panel that is rigid and not easily bendable, or a flexible display panel that is flexible and easily bendable, foldable, and/or rollable. In various examples, the display panel 300 may include a foldable display panel that may be folded and unfolded, a curved display panel in which at least a portion of a display surface is curved or bent, a bendable display panel in which a region excluding a display surface is bent, a rollable display panel that may be rolled and/or unrolled, or a stretchable display panel that may be stretched and/or unstretched.

The display panel 300 may include a transparent display panel. In this case, because the display panel 300 has a transparent characteristic, a user may view, through the top surface of the display panel 300, an object or a background at a rear surface of the display panel 300. In another example, the display panel 300 may include a reflective display panel that may reflect an object or a background on the display panel 300.

As shown in FIG. 1, the display panel 300 includes the bending area BA at (e.g., in or on) one side (e.g., in the (−) Y-direction) of the display panel 300, and the display panel 300 may be bent in the bending area BA as shown in FIG. 3. In other words, for convenience, FIG. 1 shows the display panel 300 that is in an unbent state. Because the display panel 300 is bent, a pad area PDA may be arranged below (e.g., in a (−) Z-direction) another portion (e.g., a rear portion) of the display panel 300.

As described above, the display panel 300 may be bent in the bending area BA, and accordingly, the pad area PDA may overlap with the display area DA in a thickness direction (e.g., a Z-axis direction) of the display panel 300. The display driver 320 and the display circuit board 310 may be arranged at (e.g., in or on) the pad area PDA. In an embodiment, the display driver 320 and the display circuit board 310 may be arranged over the substrate SUB (e.g., in a pre-bent state of the substrate SUB). In another embodiment, in the case where wirings are arranged by drilling a hole in the substrate SUB, the display driver 320 and the display circuit board 310 may be arranged below the substrate SUB (e.g., in a pre-bent state of the substrate SUB).

The display driver 320 may receive control signals and power voltages, and may generate and output signals and voltages for driving the display panel 300. The display driver 320 may include an integrated circuit (IC).

The display circuit board 310 may be electrically connected to the display panel 300. As an example, as shown in FIG. 3, the display circuit board 310 may be electrically connected to a pad portion on the substrate SUB through an anisotropic conductive film.

The display circuit board 310 may include a flexible printed circuit board (FPCB) that is bendable, or a rigid printed circuit board (PCB) that is rigid and not easily bent. Depending on the case, the display circuit board 310 may include a composite printed circuit board including both the rigid PCB and the FPCB.

The sensor driver 330 may be arranged on the display circuit board 310. The sensor driver 330 may include an integrated circuit. The sensor driver 330 may be attached on the display circuit board 310. The sensor driver 330 may be electrically connected to the sensor electrodes of the sensor electrode layer SENL of the display panel 300 through the display circuit board 310.

A power supply unit (e.g., a power supply) and the like may be additionally arranged on the display circuit board 310. The power supply unit may supply driving voltages for driving the pixels of the display panel 300, the scan driver, and the display driver 320. In another example, the power supply unit may be integrated with the display driver 320. In this case, the display driver 320 and the power supply unit may be implemented in one integrated circuit.

The display circuit board 310 may be electrically connected to a main circuit board. The main circuit board may include, for example, the main processor including an integrated circuit, a camera apparatus, a wireless communication unit (e.g., a wireless communication circuit or device), an input unit (e.g., an input circuit or device), an output unit (e.g., an output circuit or device), an interface unit (e.g., an interface circuit or device), a memory, and/or a power supply unit (e.g., a power supply).

The panel bottom cover PB may be arranged under the display panel 300. The panel bottom cover PB may be attached on the bottom surface of the display panel 300 through an adhesive member. The adhesive member may include a pressure sensitive adhesive (PSA). The panel bottom cover PB may include at least one of a light-absorbing member for absorbing light incident from the outside, a buffer member for absorbing an external impact, and/or a heat-dissipating member for efficiently dissipating heat of the display panel 300. In addition, an adhesive member 391 may be arranged between the panel bottom cover PB and the display circuit board 310 to connect (e.g., to fix or attach) the display circuit board 310 to the panel bottom cover PB.

The light-absorbing member may be arranged below the display panel 300. The light-absorbing member blocks or substantially blocks light transmission, and thus, prevents or substantially prevents elements, for example, the display circuit board 310 and the like, that are arranged below the light-absorbing member from being viewed from above the display panel 300. The light-absorbing member may include a light-absorbing material, for example, such as a black pigment and/or a black dye.

The buffer member may be arranged below the light-absorbing member. The buffer member may absorb an external impact to prevent or substantially prevent the display panel 300 from being damaged or destroyed. The buffer member may have a single-layer structure or a multi-layered structure. As an example, the buffer member may include a polymer resin, for example, such as polyurethane, polycarbonate, polypropylene, and/or polyethylene, or an elastic material, for example, such as rubber, a urethane-based material, or a sponge formed by foam-molding an acryl-based material.

The heat-dissipating member may be arranged below the buffer member. The heat-dissipating member may include a first heat-dissipating layer and a second heat-dissipating layer. The first heat-dissipating layer may include graphite or carbon nanotubes, and the second heat-dissipating layer may include a metal thin film, for example, such as copper, nickel, ferrite, and/or silver, that may shield electromagnetic waves and may have a suitable thermal conductivity (e.g., an excellent thermal conductivity).

Figure 4:
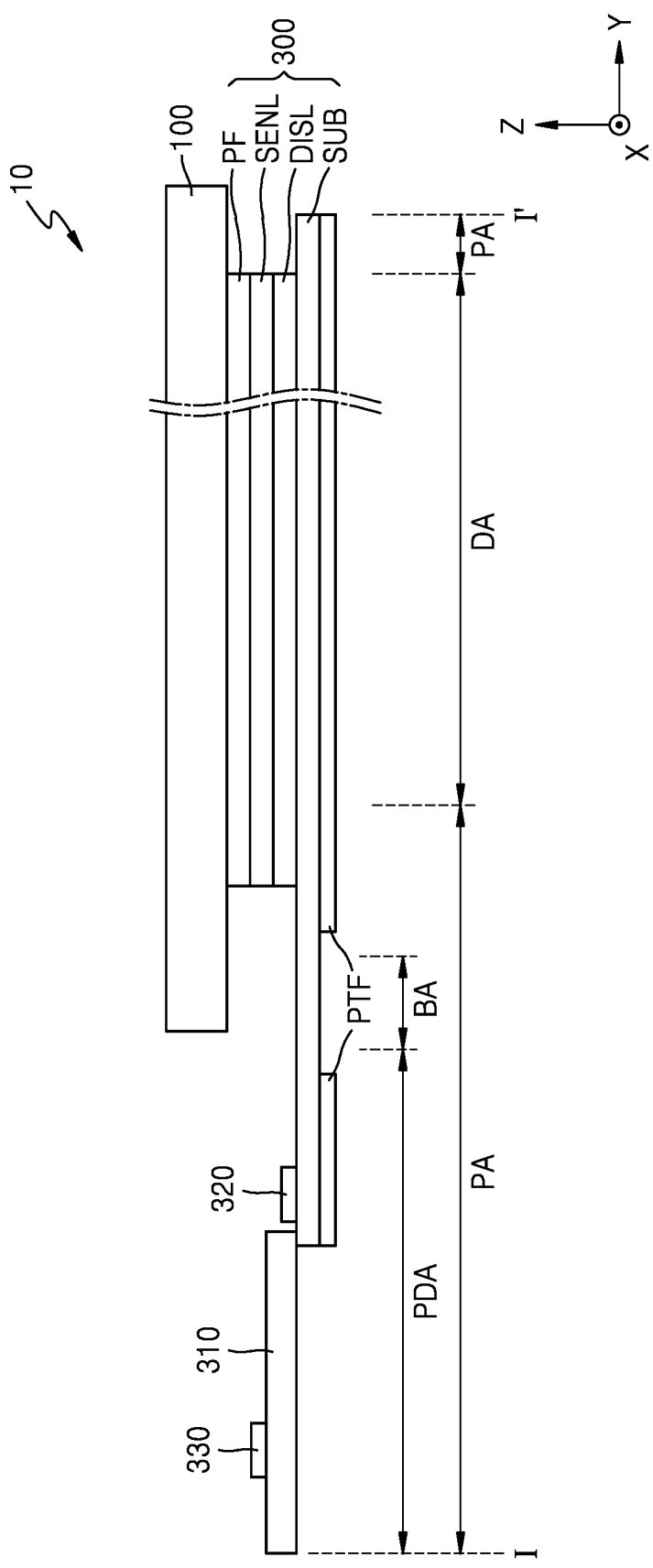
FIG. 4 is a cross-sectional view of a portion of a display apparatus according to an embodiment.
Figure 5:
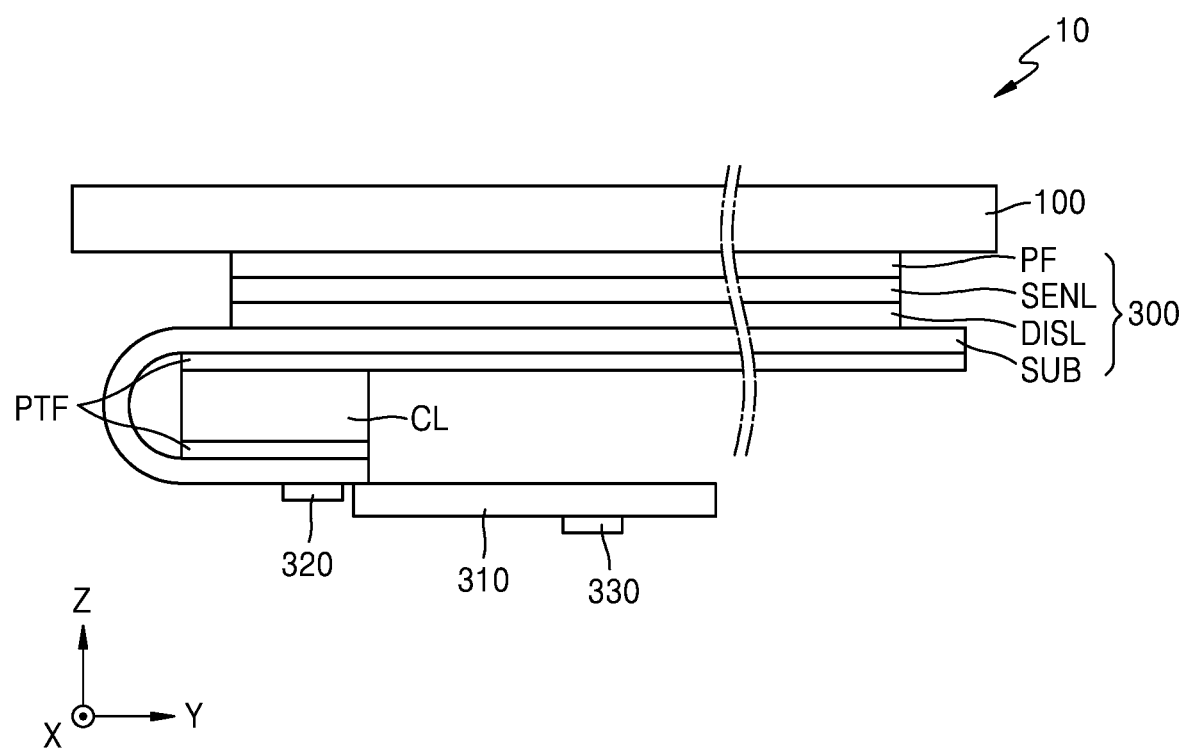
FIG. 5 is a cross-sectional view of the display apparatus of FIG. 4 in a bent state.

FIG. 4 is a cross-sectional view of a portion of the display apparatus 10 according to an embodiment, and FIG. 5 is a cross-sectional view of the display apparatus 10 of FIG. 4 in a bent state. For example, FIG. 4 is a cross-sectional view taken along the line I-I' of FIG. 1.

Referring to FIGS. 4 and 5, the display circuit board 310 may be connected to the pad portion that is arranged on the front surface (e.g., the top surface) of the substrate SUB through an anisotropic conductive film. A patterned protective film PTF may be attached to the backside (e.g., the bottom or rear surface) of the substrate SUB. In other words, the patterned protective film PTF may be attached to the backside of the substrate SUB, and may be attached to a portion of the substrate SUB that excludes (e.g., that is outside of) the bending area BA. The patterned protective film PTF may include a first portion and a second portion. The first portion may correspond to a portion including the central portion of the substrate SUB, and the second portion may be spaced apart from the first portion and may correspond to the edge of one side of the substrate SUB. A cushion layer CL (e.g., see FIG. 5) may be arranged between the first portion and the second portion of the patterned protective film PTF.

Figure 6:
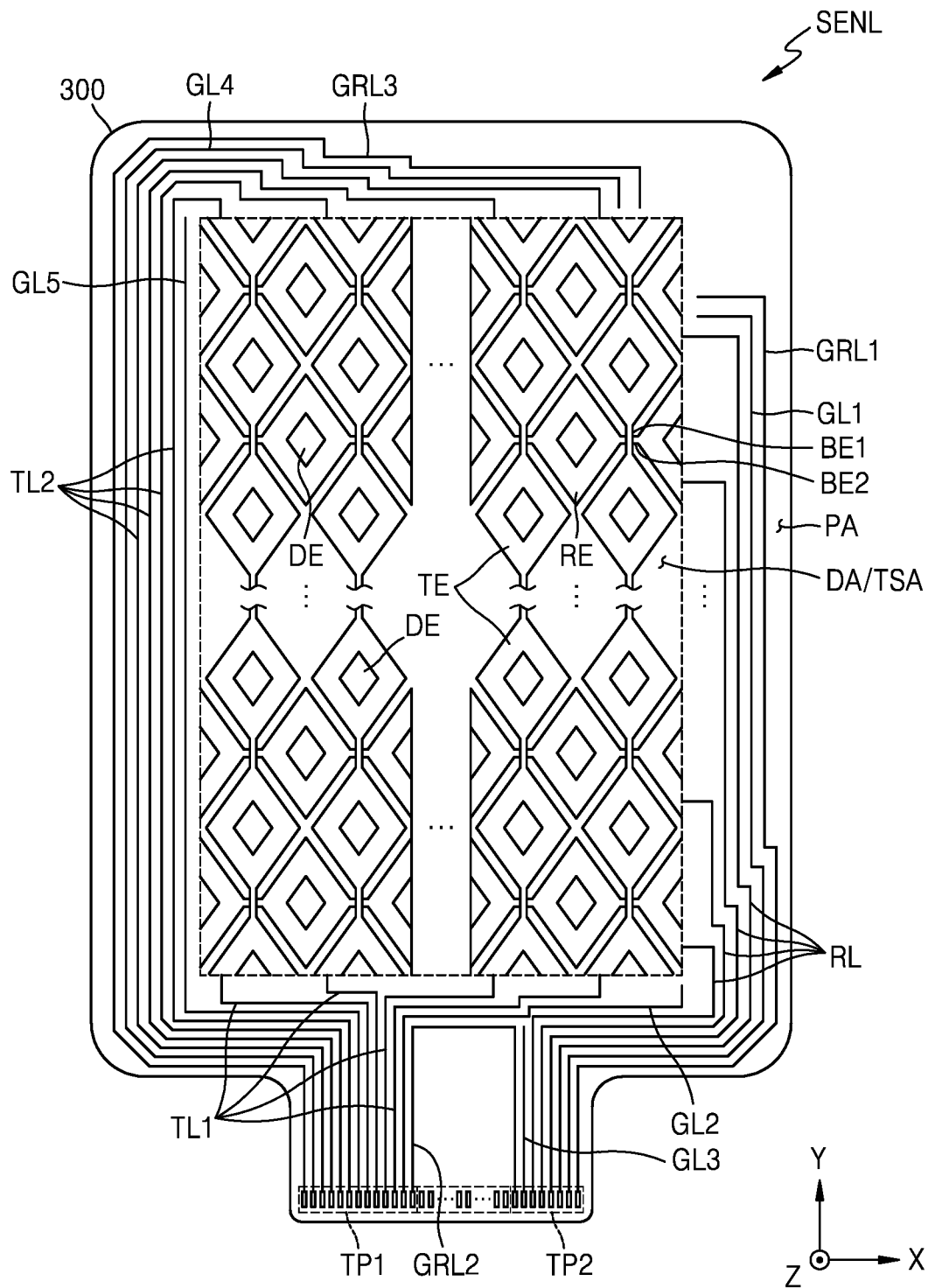
FIG. 6 is a plan view of a portion of a display apparatus according to an embodiment.
Figure 7:
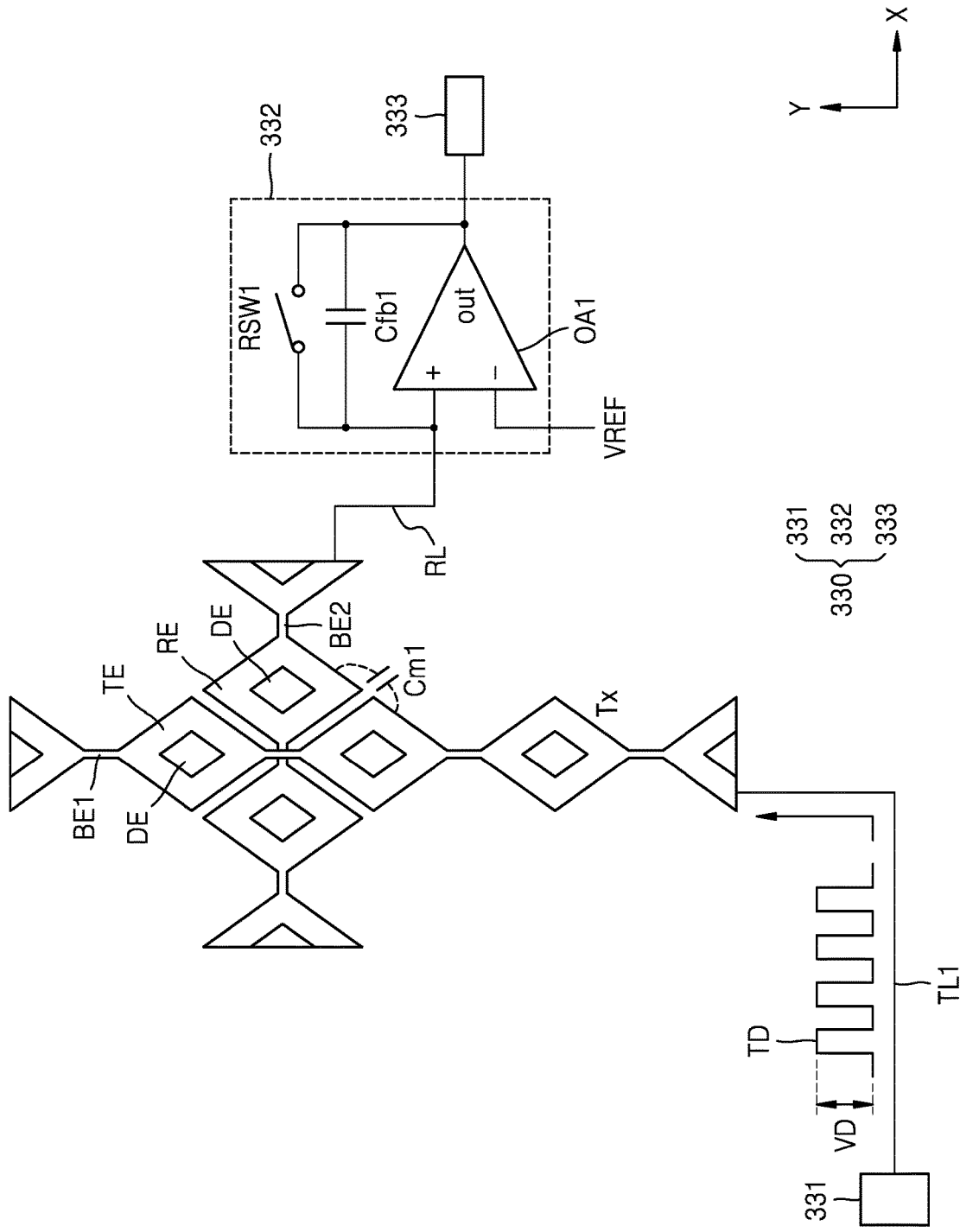
FIG. 7 is a conceptual view of a portion of the display apparatus of FIG. 6.

FIG. 6 is a plan view of a portion of the display apparatus 10 according to an embodiment, and FIG. 7 is a conceptual view of a portion of the display apparatus 10 of FIG. 6.

FIG. 6 shows that the sensor electrodes of the sensor electrode layer SENL include two kinds of electrodes, for example, driving electrodes TE and sensing electrodes RE. Hereinafter, for convenience, the case where the display apparatus 10 is driven in a mutual capacitive method of two layers is mainly described, in which driving signals are applied to the driving electrodes TE and voltages charged in mutual capacitances are sensed through the sensing electrodes RE, but the present disclosure is not limited thereto. For convenience of illustration and related description, FIG. 6 shows some of the sensor electrodes (e.g., the driving electrodes TE and the sensing electrodes RE), dummy patterns DE, sensor lines TL1, TL2, and RL, sensor pads (e.g., a first sensor pad TP2 and a second sensor pad TP2), guard lines GL1, GL2, GL3, GL4, and GL5, and grounding lines CRL1, CRL2, and CRL3 of the sensor electrode layer SENL.

Referring to FIG. 6, the sensor electrodes may include first sensor electrodes TE and second sensor electrodes RE. Hereinafter, the case where the first sensor electrode is the driving electrode TE and the second sensor electrode is the sensing electrode RE is described. Although it is shown in FIG. 6 that the driving electrodes TE, the sensing electrodes RE, and the dummy patterns DE each have a planar rhombus shape (e.g., a rhombus shape in a plan view), the present disclosure is not limited thereto, and each of the driving electrodes TE, the sensing electrodes RE, and the dummy patterns DE may have any suitable planar shape.

The sensing electrodes RE may be arranged in the first direction (e.g., the X-axis direction), and may be electrically connected to each other. The driving electrodes TE may be arranged in the second direction (e.g., the Y-axis direction) crossing the first direction (e.g., the X-axis direction), and may be electrically connected to each other. The driving electrodes TE and the sensing electrodes RE may be electrically separated (e.g., electrically insulated) from each other. The driving electrodes TE and the sensing electrodes RE may be spaced apart from each other. To allow the sensing electrodes RE and the driving electrodes TE to be electrically separated from each other at (e.g., in or on) crossing regions thereof, the driving electrodes TE neighboring each other (e.g., that are adjacent to each other) in the second direction (e.g., the Y-direction) may be connected to each other through a first connector BE1, and the sensing electrodes RE neighboring each other (e.g., that are adjacent to each other) in the first direction (e.g., the X-axis direction) may be connected to each other through a second connector BE2.

The dummy patterns DE may be electrically separated (e.g., electrically insulated) from the driving electrodes TE and the sensing electrodes RE. The driving electrodes TE, the sensing electrodes RE, and the dummy patterns DE may be spaced apart from one another. Each of the dummy patterns DE may be surrounded (e.g., around a periphery thereof) by the driving electrodes TE and/or the sensing electrodes RE. Each dummy pattern DE may be electrically floated.

A parasitic capacitance between an opposite electrode 230 (e.g., see FIG. 10) of a display element described in more below and the driving electrode TE, and/or a parasitic capacitance between the opposite electrode 230 and the sensing electrode RE may be reduced due to the dummy patterns DE. In the case where a parasitic capacitance is reduced, a charging speed by which a mutual capacitance between the driving electrode TE and the sensing electrode RE is charged may be increased. However, the areas of the driving electrode TE and the sensing electrode RE may be reduced due to the dummy patterns DE, and accordingly, a mutual capacitance between the driving electrode TE and the sensing electrode RE may be reduced. As a result, a voltage charged in the mutual capacitance may be influenced (e.g., may be easily influenced) by noise. Therefore, the areas of the dummy patterns DE may be appropriately set (e.g., may be appropriately determined or designed) by taking into account a parasitic capacitance and a mutual capacitance.

The sensor lines TL1, TL2, and RL may be arranged at (e.g., in or on) the peripheral area PA. The sensor lines TL1, TL2, and RL may include a sensing line RL connected to the sensing electrodes RE, and a first driving line TL1 and a second driving line TL2 each connected to the driving electrodes TE.

The sensing electrodes RE arranged at (e.g., in or on) one side of a sensor area TSA (e.g., corresponding to the display area DA) may be connected to the sensing lines RL. As an example, as shown in FIG. 6, a sensing electrode RE arranged on a right end (e.g., a right side) of the sensor area TSA from among the sensing electrodes RE that are electrically connected to each other in the first direction (e.g., the X-axis direction) may be connected to the sensing line RL. The sensing line RL may be connected to the second sensor pads TP2. Therefore, the sensor driver 330 may be electrically connected to the sensing electrodes RE through the second sensor pads TP2 and the sensing line RL.

The driving electrodes TE arranged at (e.g., in or on) one side of the sensor area TSA (e.g., corresponding to the display area DA) may be connected to the first driving lines TL1, and the driving electrodes TE arranged at (e.g., in or on) another side of the sensor area TSA (e.g., corresponding to the display area DA) may be connected to the second driving lines TL2. As an example, as shown in FIG. 6, the driving electrode TE arranged on the bottom end (e.g., a lower side) of the sensor area TSA from among the driving electrodes TE that are electrically connected to each other in the second direction (e.g., the Y-axis direction) may be connected to the first driving line TL1, and the driving electrode TE arranged on the top end (e.g., an upper side) of the sensor area TSA from among the driving electrodes TE may be connected to the second driving line TL2. The second driving line TL2 may be connected to the driving electrodes TE on the top side (e.g., the top end or the upper side) of the sensor area TSA by extending along the peripheral area PA at the left outer side of the sensor area TSA. The first driving line TL1 and the second driving line TL2 may be connected to the first sensor pads TP1. Therefore, the sensor driver 330 may be electrically connected to the driving electrodes TE through the first sensor pads TP1 and the first and second driving lines TL1 and TL2.

The first guard line GL1 may be arranged outside the sensing line RL that is arranged at an outermost portion from among the sensing lines RL. In addition, the first grounding line GRL1 may be arranged outside the first guard line GL1. As shown in FIG. 6, the first guard line GL1 may be arranged on the right side of the sensing line RL that is arranged on the right end from among the sensing lines RL, and the first grounding line GRL1 may be arranged on the right side of the first guard line GL1.

The second guard line GL2 may be arranged between the sensing line RL that is arranged on an innermost portion from among the sensing lines RL and the first driving line TL1 that is arranged on the right end from among the first driving lines TL1. As shown in FIG. 6, the sensing line RL arranged on the innermost portion from among the sensing lines RL may be the sensing line RL arranged on the left end from among the sensing lines RL. In addition, the second guard line GL2 may be arranged between the second grounding line GRL2 and the first driving line TL1 that is arranged on the right end from among the first driving lines TL1.

The third guard line GL3 may be arranged between the second grounding line GRL2 and the sensing line RL that is arranged on the innermost portion from among the sensing lines RL. The second grounding line GRL2 may be connected to the first sensor pad TP1 that is arranged on a rightmost portion from among the first sensor pads TP1 and the second sensor pad TP2 that is arranged on a leftmost portion from among the second sensor pads TP2. For example, the second grounding line GRL2 may have a loop shape with an open end.

The fourth guard line GL4 may be arranged outside the second driving line TL2 that is arranged on an outermost portion from among the second driving lines TL2. As shown in FIG. 6, the fourth guard line GL4 may be arranged on the left side of the second driving line TL2 that is arranged on the left end from among the second driving lines TL2. The third grounding line GRL3 may be arranged outside the fourth guard line GL4. As shown in FIG. 6, the fourth guard line GL4 may be arranged on the left side and the top side of the second driving line TL2 that is arranged on the left side and the top end from among the second driving lines TL2. The third grounding line GRL3 may be arranged on the left side and the top side of the fourth guard line GL4.

The fifth guard line GL5 may be arranged inside the second driving line TL2 that is arranged on an innermost portion from among the second driving lines TL2. As shown in FIG. 6, the fifth guard line GL5 may be arranged between the second driving line TL2 arranged on the right end from among the second driving lines TL2 and the sensing electrodes RE.

A grounding voltage (e.g., a ground voltage) may be applied to the first grounding line CRL1, the second grounding line CRL2, and the third grounding line GRL3. In addition, a grounding voltage (e.g., a ground voltage) may be applied to the first guard line GL1, the second guard line GL2, the third guard line GL3, the fourth guard line GL4, and the fifth guard line GL5.

As shown in FIG. 6, the driving electrodes TE that neighbor each other (e.g., that are adjacent to each other) in the second direction (e.g., the Y-axis direction) are electrically connected to each other, and the driving electrodes TE that neighbor each other (e.g., that are adjacent to each other) in the first direction (e.g., the X-axis direction) are electrically insulated from each other. In addition, the sensing electrodes RE that neighbor each other (e.g., that are adjacent to each other) in the first direction (e.g., the X-axis direction) are electrically connected to each other, and the sensing electrodes RE that neighbor each other (e.g., that are adjacent to each other) in the second direction (e.g., the Y-axis direction) are electrically insulated from each other. Therefore, a mutual capacitance may be formed at crossing regions (e.g., at crossing points) of the driving electrodes TE and the sensing electrodes RE.

In addition, as shown in FIG. 6, because the first guard line GL1 is arranged between the sensing line RL that is arranged on the outermost portion from among the sensing lines RL and the first grounding line GRL1, it may be possible to reduce the influence of a voltage change of the first grounding line GRL1 on the sensing line RL on the outermost portion. The second guard line GL2 is arranged between the sensing line RL that is arranged on the innermost portion from among the sensing lines RL and the first driving line TL1 that is arranged on the right end from among the first driving lines TL1. Therefore, an influence of a voltage change on the sensing line RL arranged on the innermost portion and the first driving line TL1 arranged on the right end may be reduced. Because the third guard line GL3 is arranged between the sensing line RL that is arranged on the innermost portion from among the sensing lines RL and the second grounding line GRL2, an influence of a voltage change of the second grounding line GRL2 on the sensing electrode RL arranged on the innermost portion may be reduced. Because the fourth guard line GL4 is arranged between the second driving line TL2 that is arranged on the outermost portion from among the second driving lines TL2 and the third grounding line GRL3, an influence of a voltage change of the third grounding line GRL3 on the second driving line TL2 arranged on the outermost portion may be reduced. Because the fifth guard line GL5 is arranged between the second driving line TL2 that is arranged on the innermost portion from among the second driving lines TL2 and the sensor electrodes TE and RE, an influence of the second driving line TL2 arranged on the innermost portion and the sensor electrodes TE and RE on each other may be reduced.

FIG. 7 is an example view of a sensor driver connected to sensor electrodes.

For convenience of illustration, FIG. 7 shows some of the driving electrodes TE arranged at (e.g., in or on) one column and electrically connected to each other in the second direction (e.g., the Y-axis direction), and some of the sensing electrodes RE arranged at (e.g., in or on) one row and electrically connected to each other in the first direction (e.g., the X-axis direction).

Referring to FIG. 7, the sensor driver 330 may include a driving signal output portion (e.g., a driving signal output circuit) 331, a first sensor sensing portion (e.g., a first sensor sensing circuit) 332, and a first analog-to-digital converter 333.

The driving signal output portion 331 may output a touch driving signal TD to the driving electrodes TE through the first driving line TL1 and the second driving line TL2. The touch driving signal TD may include a plurality of pulses.

The driving signal output portion 331 may output the touch driving signal TD to the first and second driving lines TL1 and TL2 according to a suitable or desired order (e.g., a predetermined order or an order set in advance). As an example, the driving signal output portion 331 may sequentially output the touch driving signal TD starting from the driving electrodes TE arranged at (e.g., in or on) the left of the display area DA to the driving electrodes TE arranged at (e.g., in or on) the right of the display area DA.

The first sensor sensing portion 332 senses a voltage charged in a first mutual capacitance Cm1 through the sensing line RL electrically connected to the sensing electrodes RE. As shown in FIG. 7, the first mutual capacitance Cm1 may be formed between the driving electrode TE and the sensing electrode RE.

The first sensor sensing portion 332 may include a first operational amplifier OA1, a first feedback capacitor Cfb1, and a first reset switch RSW1. The first operational amplifier OA1 may include a first input terminal (+), a second input terminal (−), and an output terminal (out). The first input terminal (+) of the first operational amplifier OA1 may be connected to the sensing line RL. An initialization voltage VREF is supplied to the second input terminal (−). The first feedback capacitor Cfb1 may be connected to the output terminal (out) of the first operational amplifier OA1. The first feedback capacitor Cfb1 is connected between the output terminal (out) and the first input terminal (+) of the first operational amplifier OA1 to store an output voltage of the first operational amplifier OA1. The first feedback capacitor Cfb1 and the first reset switch RSW1 may be parallel-connected between the first input terminal (+) and the output terminal (out) of the first operational amplifier OA1. The first reset switch RSW1 controls connection of two opposite ends of the first feedback capacitor Cfb1. When the first reset switch RSW1 is turned on, the two opposite ends of the first feedback capacitor Cfb1 are connected to each other, and the first feedback capacitor Cfb1 may be reset.

An output voltage of the first operational amplifier OA1 may be defined as $Vout1=(Cm1 \times Vt1)/Cfb1$. Here, "Cfb1" refers to the capacity (e.g., the capacitance) of the first feedback capacitor Cfb1, "Cm1" refers to the capacity (e.g., the capacitance) of the first mutual capacitance Cm1, and "Vt1" refers to a voltage charged in the first mutual capacitance Cm1.

The first analog-to-digital converter 333 may convert the output voltage Vout1 stored in the first feedback capacitor Cfb1 to first digital data, and may output the first digital data.

As shown in FIG. 7, the sensor electrode layer SENL may determine whether a user applies a touch input by sensing voltages charged in the first mutual capacitances Cm1.

Figure 8:
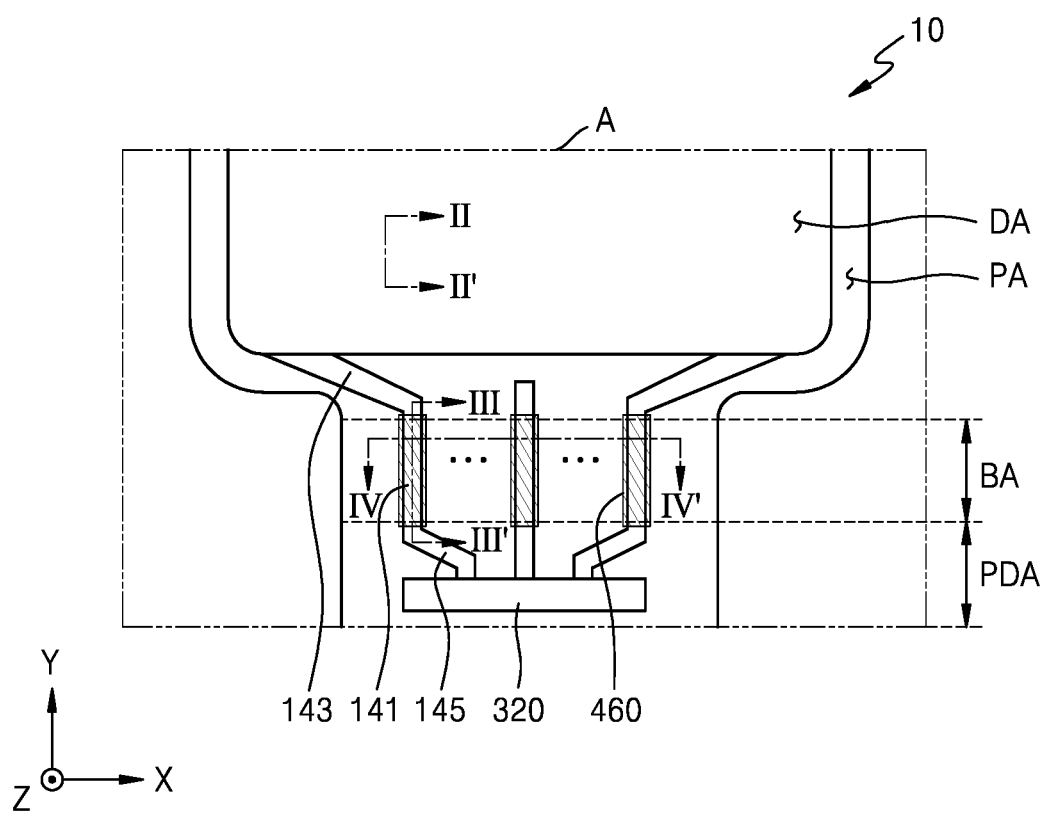
FIG. 8 is a plan view of a portion of a display apparatus according to an embodiment.
Figure 9:
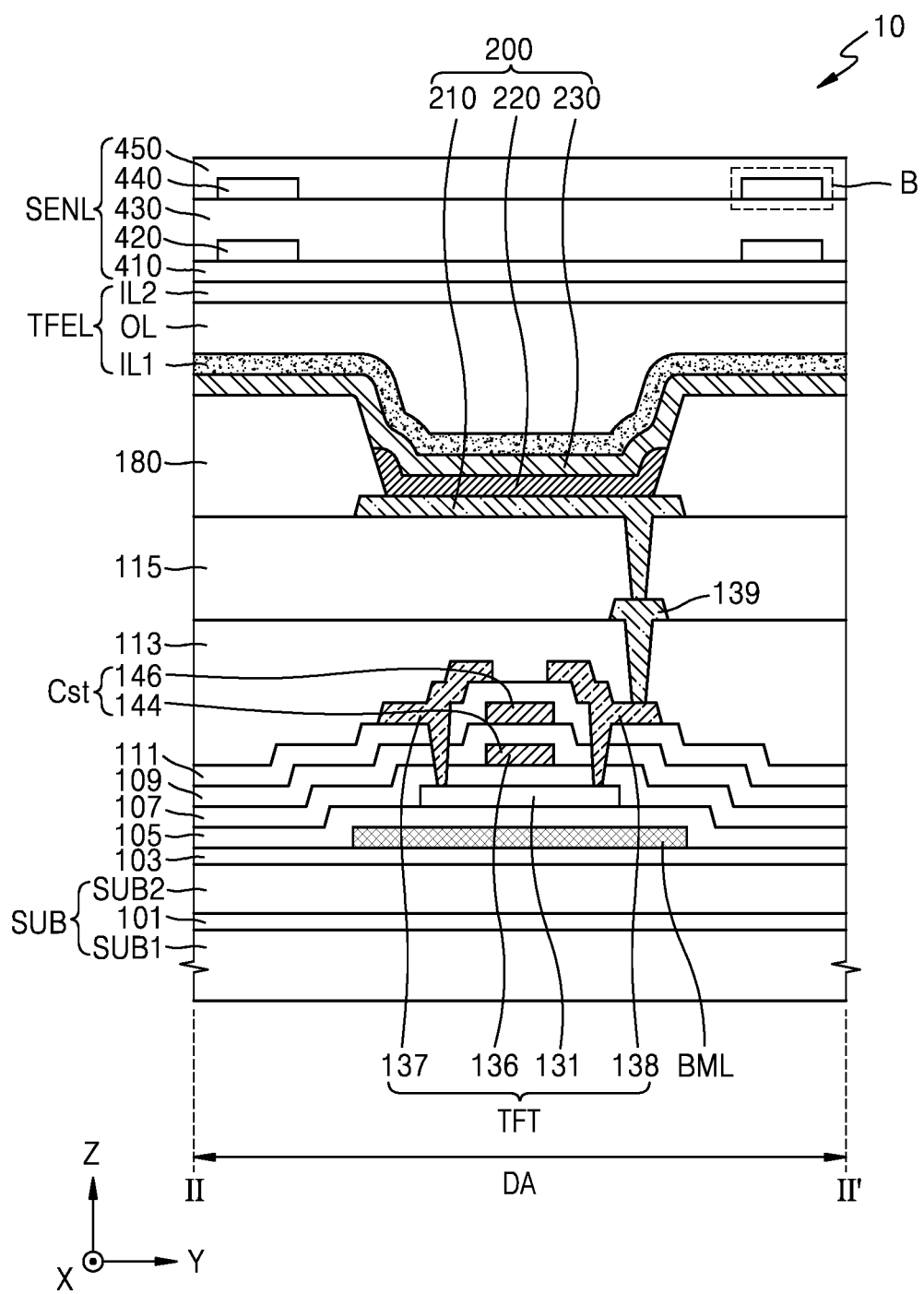
FIG. 9 is a cross-sectional view of a portion of a display apparatus according to an embodiment.

FIG. 8 is a plan view of a portion of the display apparatus 10 according to an embodiment, and FIG. 9 is a cross-sectional view of a portion of the display apparatus 10 according to an embodiment. For example, FIG. 8 corresponds to an enlarged plan view of the region A of FIG. 1, and FIG. 9 corresponds to a cross-sectional view of the display apparatus 10 taken along the line II-II' of FIG. 8.

Referring to FIG. 8, the display apparatus 10 according to the present embodiment may include a first conductive line 141, a second conductive line 143, and a third conductive line 145. The first conductive line 141 may be arranged at (e.g., in or on) the bending area BA, the second conductive line 143 may be arranged at (e.g., in or on) the peripheral area PA between the display area DA and the bending area BA, and the third conductive line 145 may be arranged at (e.g., in or on) the pad area PDA.

The first conductive line 141, the second conductive line 143, and the third conductive line 145 may transfer a data signal that is applied from the display driver 320 or a scan signal to the display area DA. In addition, the first conductive line 141, the second conductive line 143, and the third conductive line 145 may transfer a driving voltage or a common voltage to the display area DA.

Because stress may be concentrated at the bending area BA, the first conductive line 141 that is arranged at (e.g., in or on) the bending area BA may not be bent (e.g., may have a straight shape when the display panel 300 is in an unbent state), and may extend in the second direction (e.g., the Y-axis direction) in a plan view. In the plan view, the second conductive line 143 and the third conductive line 145 may have a bent shape as shown in FIG. 8.

The first conductive line 141 may be provided in a plurality, and the plurality of first conductive lines 141 may be spaced apart from each other at (e.g., in or on) the bending area BA. A metal pattern 460 may be arranged over the first conductive line 141. The metal pattern 460 may be electrically floated and arranged over the first conductive line 141. In some embodiments, the metal pattern 460 may be connected to a separate circuit portion. The metal pattern 460 may be provided in a plurality, and the plurality of metal patterns 460 may be spaced apart from each other. Each metal pattern 460 may overlap with at least a portion of the first conductive line 141 therebelow.

Referring to FIG. 9, a thin-film transistor TFT and a display element 200 may be arranged over the substrate SUB.

The substrate SUB may include various suitable flexible, bendable, and/or rollable materials. As an example, the substrate SUB may include a polymer resin, for example, such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate SUB may include a first substrate SUB1, and a second substrate SUB2 arranged on the first substrate SUB1. The first substrate SUB1 and the second substrate SUB2 may include the same or substantially the same material as each other. However, the present disclosure is not limited thereto, and the first substrate SUB1 and the second substrate SUB2 may include different materials from each other.

A first barrier layer 101 may be arranged between the first substrate SUB1 and the second substrate SUB2. The first barrier layer 101 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first barrier layer 101 may include a single layer structure or a multi-layered structure including one or more of the above-mentioned inorganic insulating materials.

A second barrier layer 103 may be arranged on the second substrate SUB2. The second barrier layer 103 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The second barrier layer 103 may include a single layer structure or a multi-layered structure including one or more of the above-mentioned inorganic insulating materials. The first barrier layer 101 and the second barrier layer 103 may include the same or substantially the same material as each other. However, the present disclosure is not limited thereto, and the first barrier layer 101 and the second barrier layer 103 may include different materials from each other. In some embodiments, the second barrier layer 103 may be omitted.

A buffer layer 105 may be arranged on the second barrier layer 103. The buffer layer 105 may be arranged over the substrate SUB to reduce or block the penetration of foreign substances, moisture, and/or external air from below the substrate SUB, and may provide a flat or substantially flat surface over the substrate SUB. The buffer layer 105 may include an inorganic material, for example, such as an oxide or a nitride, an organic material, or an inorganic/organic composite material, and may have a single-layer structure or a multi-layered structure of an inorganic material and an organic material.

A bottom metal layer BML may be arranged between the second barrier layer 103 and the buffer layer 105. The bottom metal layer BML may overlap with the thin-film transistor TFT thereabove.

The thin-film transistor TFT may be arranged on the buffer layer 105. The thin-film transistor TFT may include a semiconductor layer 131, a gate electrode 136, a source electrode 137, and a drain electrode 138. The gate electrode 136 may overlap with the semiconductor layer 131, and the source electrode 137 and the drain electrode 138 may be electrically connected to the semiconductor layer 131. The thin-film transistor TFT may be connected to the display element 200 to drive the display element 200.

The semiconductor layer 131 may be arranged on the buffer layer 105, and may include a channel region, a source region, and a drain region. The channel region may overlap with the gate electrode 136. The source region and the drain region may be arranged at (e.g., in or on) opposite sides of the channel region, and may include impurities of a higher concentration than that of the channel region. Here, the impurities may include N-type impurities or P-type impurities. The source region and the drain region may be electrically connected to the source electrode 137 and the drain electrode 138, respectively.

The semiconductor layer 131 may include an oxide semiconductor and/or a silicon semiconductor. In the case where the semiconductor layer 131 includes an oxide semiconductor, the semiconductor layer 131 may include, for example, an oxide of at least one from among indium (In), gallium (Ga), stannum (Sn), zirconium (Zr), vanadium (V), hafnium (Hf), cadmium (Cd), germanium (Ge), chromium (Cr), titanium (Ti), and zinc (Zn). As an example, the semiconductor layer 131 may include InSnZnO (ITZO) and InGaZnO (IGZO). In the case where the semiconductor layer 131 includes a silicon semiconductor, the semiconductor layer 131 may include, for example, amorphous silicon (a-Si), or low temperature polycrystalline silicon (LTPS) formed by crystallizing amorphous silicon (a-Si).

A first insulating layer 107 may be arranged on the semiconductor layer 134. The first insulating layer 107 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 107 may include a single layer structure or a multi-layered structure including one or more of the above-mentioned inorganic insulating materials.

The gate electrode 136 may be arranged on the first insulating layer 107. The gate electrode 136 may include a single layer structure or a multi-layered structure including at least one metal from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line that applies an electric signal to the gate electrode 136.

A second insulating layer 109 may be arranged on the gate electrode 136. The second insulating layer 109 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 109 may include a single layer structure or a multi-layered structure including one or more of the above-mentioned inorganic insulating materials.

A storage capacitor Cst may be arranged on the first insulating layer 107. The storage capacitor Cst may include a bottom electrode 144, and a top electrode 146 overlapping with the bottom electrode 144. The bottom electrode 144 of the storage capacitor Cst may overlap with the top electrode 146 with the second insulating layer 109 therebetween.

The bottom electrode 144 of the storage capacitor Cst may overlap with the gate electrode 136 of the thin-film transistor TFT. The bottom electrode 144 of the storage capacitor Cst and the gate electrode 136 of the thin-film transistor TFT may be arranged as one body (e.g., may be integrally formed). However, the present disclosure is not limited thereto, and the storage capacitor Cst may not overlap with the thin-film transistor TFT. In this case, the bottom electrode 144 of the storage capacitor Cst may be an element independent of the gate electrode 136 of the thin-film transistor TFT.

The top electrode 146 of the storage capacitor Cst may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu), and may include a single layer or multi-layers including one or more of the above-mentioned materials.

A third insulating layer 111 may be arranged on the top electrode 146 of the storage capacitor Cst. The third insulating layer 111 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 111 may include a single layer or multi-layers including one or more of the above-mentioned inorganic insulating materials.

The source electrode 137 and the drain electrode 138 may be arranged on the third insulating layer 111. The source electrode 137 and the drain electrode 138 may include a conductive material including molybdenum (Mo), aluminum (Al), copper (Cu), and/or titanium (Ti), and may include a single layer or multi-layers including one or more of the above-mentioned materials. For example, the source electrode 137 and the drain electrode 138 may have a multi-layered structure of Ti/Al/Ti.

A first planarization layer 113 may be arranged on the source electrode 137 and the drain electrode 138. The first planarization layer 113 may include a single layer or multi-layers including an organic material and/or an inorganic material. In an embodiment, the first planarization layer 113 may include a general-purpose polymer, for example, such as benzocyclobutene (BCB), polyimide (PI), hexamethyldisiloxane (HMDSO), polymethylmethacrylate (PMMA), or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The first planarization layer 113 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). After the first planarization layer 113 is formed, a chemical mechanical polishing process may be performed to provide a flat or substantially flat top surface.

A connection electrode 139 may be arranged on the first planarization layer 113. The connection electrode 139 may include at least one from among aluminum (Al), copper (Cu), and titanium (Ti), and may include a single layer structure or a multi-layered structure. For example, the connection electrode 139 may have a multi-layered structure of Ti/Al/Ti.

A second planarization layer 115 may be arranged on the connection electrode 139. The second planarization layer 115 may include a single layer or multi-layers including an organic material and/or an inorganic material. The second planarization layer 115 may include the same or substantially the same material as that of the first planarization layer 113. However, the present disclosure is not limited thereto, and the second planarization layer 115 may include a material different from that of the first planarization layer 113.

The display element 200 may be arranged on the second planarization layer 115. The display element 200 may include a pixel electrode 210, an intermediate layer 220, and an opposite electrode 230. As an example, the display element 200 including the pixel electrode 210, the intermediate layer 220, and the opposite electrode 230 may be an organic light-emitting diode OLED.

The pixel electrode 210 is electrically connected to the connection electrode 139 through a contact hole passing (e.g., penetrating or extending) through the second planarization layer 115, and the connection electrode 139 is electrically connected to the source electrode 137 or the drain electrode 138 of the thin-film transistor TFT through a contact hole passing (e.g., penetrating or extending) through the first planarization layer 113. Accordingly, the display element 200 may be electrically connected to the thin-film transistor TFT.

The pixel electrode 210 may be arranged on the second planarization layer 115. The pixel electrode 210 may include a (semi) transparent electrode or a reflective electrode. The pixel electrode 210 may include a reflective layer, and a transparent or semi-transparent electrode layer on the reflective layer. The reflective layer may include at least one from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and a compound thereof. The transparent or semi-transparent electrode layer may include at least one from among indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may have a stacked structure of ITO/Ag/ITO.

A pixel-defining layer 180 may be arranged on the second planarization layer 115, and may include an opening that exposes at least a portion of the pixel electrode 210. A region of the pixel electrode 210 exposed by the opening of the pixel-defining layer 180 may be defined as an emission area. The surroundings of the emission area may be a non-emission area. The non-emission area may surround (e.g., around peripheries of) the emission areas. In other words, the display area DA may include a plurality of emission areas, and the non-emission area surrounding (e.g., around peripheries of) the plurality of emission areas. The pixel-defining layer 180 may prevent or substantially prevent an arc and/or the like from occurring at the edges of the pixel electrode 210 by increasing a distance between the pixel electrode 210 and the opposite electrode 230 arranged over the pixel electrode 210. The pixel-defining layer 180 may include an organic insulating material, for example, such as polyimide, polyamide, an acrylic resin, BCB, HMDSO, and/or a phenolic resin, and may be formed through spin coating and/or the like.

The intermediate layer 220 may be formed on the portion of the pixel electrode 210 that is exposed by the pixel-defining layer 180. The intermediate layer 220 may include an emission layer. A first functional layer and/or a second functional layer may be selectively arranged under and/or on the emission layer.

The intermediate layer 220 may be arranged on the portion of the pixel electrode 210 exposed by the pixel-defining layer 180. In an embodiment, the emission layer of the intermediate layer 220 may be arranged on the portion of the pixel electrode 210 exposed by the pixel-defining layer 180.

The first functional layer may include a hole injection layer (HIL) and/or a hole transport layer (HTL). The second functional layer may include an electron transport layer (ETL) and/or an electron injection layer (EIL).

The emission layer may include an organic material including a fluorescent or a phosphorous material for emitting red, green, blue, or white light. The emission layer may include a low molecular weight organic material or a polymer organic material.

In the case where the emission layer includes a low molecular weight organic material, the intermediate layer 220 may have a structure in which a HIL, a HTL, an emission layer, an ETL, an EIL, and/or the like are stacked in a single or composite configuration. The intermediate layer 220 may include, as a low molecular weight organic material, various suitable organic materials, for example, such as copper phthalocyanine (CuPc), N,N'-Di (naphthalene-1-yl)-N,N'-diphenyl-benzidine (NPB), and/or tris-8-hydroxyquinoline aluminum ($Alq_3$). These layers may be formed by vacuum deposition.

In the case where the emission layer includes a polymer organic material, the intermediate layer 220 may have a structure including a HTL and an emission layer in general. In this case, the HTL may include poly-3,4-ethylene dioxy thiophene (PEDOT), and the emission layer may include a polymer material, for example, such as a polyphenylene vinylene (PPV)-based material and/or a polyfluorene-based material. The emission layer may be formed through screen printing, inkjet printing, laser induced thermal imaging (LITI), and/or the like.

The opposite electrode 230 may be arranged on the intermediate layer 220. The opposite electrode 230 may entirely cover the intermediate layer 220. The opposite electrode 230 is arranged on the display area DA, and may cover an entirety of the display area DA. In other words, the opposite electrode 230 may be formed as one body over the entire display panel to cover the plurality of pixels arranged at (e.g., in or on) the display area DA by using an open mask.

The opposite electrode 230 may include a conductive material having a low work function. For example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. As another example, the opposite electrode 230 may further include a layer including IZO, ZnO, or $In_2O_3$ on the (semi) transparent layer including one or more of the above-mentioned materials.

An encapsulation layer TFEL may be arranged on the display element 200, for example, on the opposite electrode 230. The encapsulation layer TFEL may include at least one inorganic encapsulation layer, and at least one organic encapsulation layer. The encapsulation layer TFEL may prevent or reduce the penetration of oxygen, moisture, and/or the like into the opposite electrode 230 and the intermediate layer 220 including the emission layer. As an example, the encapsulation layer TFEL may include a first inorganic encapsulation layer IL1, an organic encapsulation layer OL, and a second inorganic encapsulation layer IL2. The first inorganic encapsulation layer IL1 may be on the opposite electrode 230, the organic encapsulation layer OL may be on the first inorganic encapsulation layer IL1, and the second inorganic encapsulation layer IL2 may be on the organic encapsulation layer OL. The first inorganic encapsulation layer IL1 and the second inorganic encapsulation layer IL2 may include silicon nitride, silicon oxynitride, silicon oxide, titanium oxide, or aluminum oxide. The organic encapsulation layer OL may include an acrylic resin, an epoxy resin, a phenolic resin, a polyamide resin, or a polyimide resin.

The encapsulation layer TFEL extends to the outside of the display area DA. The first inorganic encapsulation layer IL1 may contact the second inorganic encapsulation layer IL2 at the outside of the display area DA.

The sensor electrode layer SENL may be arranged on the encapsulation layer TFEL. The sensor electrode layer SENL may include a first sensor insulating layer 410, a second sensor insulating layer 430, and a third sensor insulating layer 450. In addition, the sensor electrode layer SENL may include a first sensor electrode 420 and a second sensor electrode 440. The first sensor electrode 420 may be between the first sensor insulating layer 410 and the second sensor insulating layer 430, and the second sensor electrode 440 may be between the second sensor insulating layer 430 and the third sensor insulating layer 450. The first sensor electrode 420 and the second sensor electrode 440 may be the driving electrodes TE and the sensing electrodes RE described above with reference to FIG. 6. The first sensor electrode 420 and the second sensor electrode 440 may be electrically connected to each other through a contact hole defined in the second sensor insulating layer 430.

The first sensor insulating layer 410 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first sensor insulating layer 410 may have a single-layer structure or a multi-layered structure. In another embodiment, the first sensor insulating layer 410 may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyim- ide-based resin, and/or a perylene resin. However, the present disclosure is not limited thereto, and the first sensor insulating layer 410 may be omitted.

The second sensor insulating layer 430 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first sensor insulating layer 410 may have a single-layer structure or a multi-layered structure. In another embodiment, the second sensor insulating layer 430 may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyimide-based resin, and/or a perylene resin.

Figure 10:
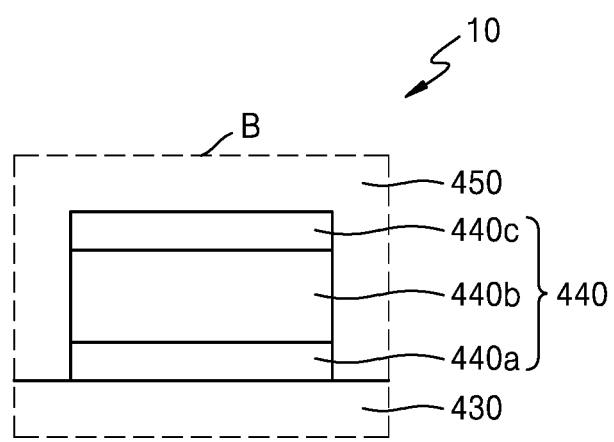
FIG. 10 is a cross-sectional view of a portion of a display apparatus according to an embodiment.

FIG. 10 is a cross-sectional view of a portion of the display apparatus 10 according to an embodiment. For example, FIG. 10 is an enlarged cross-sectional view of the region B of FIG. 9.

Referring to FIG. 10, the second sensor electrode 440 of the display apparatus 10 may include a first layer 440a, a second layer 440b, and a third layer 440c. The first layer 440a may be on the second sensor insulating layer 430, the second layer 440b may be on the first layer 440a, and the third layer 440c may be on the second layer 440b. The first layer 440a, the second layer 440b, and the third layer 440c of the second sensor electrode 440 may include at least one of molybdenum (Mo), aluminum (Al), chrome (Cr), gold (Au), titanium (Ti), nickel (Ni), neodymium (Nd), and/or copper (Cu). The first layer 440a and the second layer 440b of the second sensor electrode 440 may include different materials from each other. In addition, the second layer 440b and the third layer 440c of the second sensor electrode 440 may include different materials from each other. As an example, the first layer 440a and the third layer 440c of the second sensor electrode 440 may include titanium (Ti), and the second layer 440b of the second sensor electrode 440 may include aluminum (Al).

Figure 11:
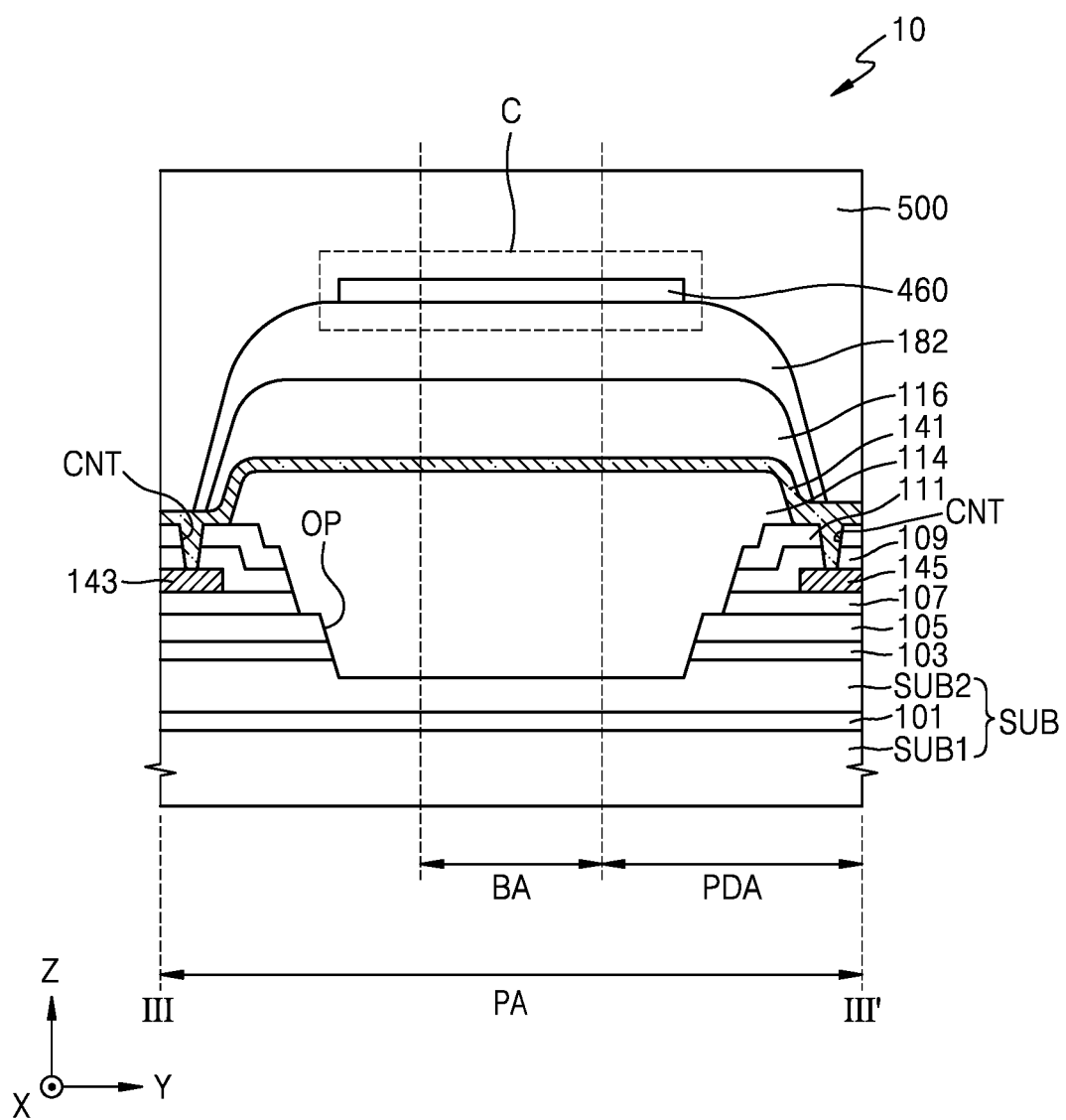
FIG. 11 is a cross-sectional view of a portion of a display apparatus according to an embodiment.

FIG. 11 is a cross-sectional view of a portion of the display apparatus 10 according to an embodiment. For example, FIG. 11 is a cross-sectional view of the display apparatus 10 taken along the line III-III' of FIG. 8.

Referring to FIG. 11, a plurality of insulating layers may be arranged on the substrate SUB. In this case, the plurality of insulating layers may include the second barrier layer 103, the buffer layer 105, the first insulating layer 107, the second insulating layer 109, and the third insulating layer 111. The plurality of insulating layers may include an opening OP corresponding to the bending area BA. A first organic insulating layer 114 may be arranged in the opening OP defined by the plurality of insulating layers. The first organic insulating layer 114 may be directly arranged on the second substrate SUB2. The first organic insulating layer 114 may include the same or substantially the same material as that of the first planarization layer 113. As an example, the first organic insulating layer 114 may be formed through the same process as a process of forming the first planarization layer 113.

The second conductive line 143 may be arranged at (e.g., in or on) the peripheral area PA. In other words, the second conductive line 143 may be arranged on the first insulating layer 107 at (e.g., in or on) the peripheral area PA. The third conductive line 145 may be arranged at (e.g., in or on) the pad area PDA. In other words, the third conductive line 145 may be arranged on the first insulating layer 107 at (e.g., in or on) the pad area PDA. The second conductive line 143 and the third conductive line 145 may include the same or substantially the same material as that of the gate electrode 136 described above with reference to FIG. 9. As an example, the second conductive line 143 and the third conductive line 145 may be formed during the same process as a process of forming the gate electrode 136.

In another embodiment, the second conductive line 143 and the third conductive line 145 may be arranged on the second insulating layer 109, instead of on the first insulating layer 107. In the case where the second conductive line 143 and the third conductive line 145 are arranged on the second insulating layer 109, the second conductive line 143 and the third conductive line 145 may include the same or substantially the same material as that of the top electrode 146 described above with reference to FIG. 9. As an example, the second conductive line 143 and the third conductive line 145 may be formed during the same process as a process of forming the top electrode 146.

The first conductive line 141 may be arranged on the first organic insulating layer 114 at (e.g., in or on) the bending area BA. At least a portion of the first conductive line 141 arranged at (e.g., in or on) the bending area BA may extend to the peripheral area PA and the pad area PDA.

The portion of the first conductive line 141 that extends to the peripheral area PA may be electrically connected to the second conductive line 143 through a contact hole CNT, and the portion of the first conductive line 141 that extends to the pad area PDA may be electrically connected to the third conductive line 145 through a contact hole CNT. The first conductive line 141 may include the same or substantially the same material as that of the connection electrode 139 described above with reference to FIG. 9. As an example, the first conductive line 141 may be formed during the same process as a process of forming the connection electrode 139.

A second organic insulating layer 116 may be arranged on the first conductive line 141. The second organic insulating layer 116 may include the same or substantially the same material as that of the second planarization layer 115 described above with reference to FIG. 9. As an example, the second organic insulating layer 116 may be formed during the same process as a process of forming the second planarization layer 115.

A third organic insulating layer 182 may be arranged on the second organic insulating layer 116. The third organic insulating layer 182 may include the same or substantially the same material as that of the pixel-defining layer 180 described above with reference to FIG. 9. As an example, the third organic insulating layer 182 may be formed during the same process as a process of forming the pixel-defining layer 180.

The metal pattern 460 may be arranged on the third organic insulating layer 182. The metal pattern 460 may be directly arranged on the third organic insulating layer 182. The metal pattern 460 may overlap with at least a portion of the first conductive line 141 therebelow. The metal pattern 460 may include the same or substantially the same material as that of the second sensor electrode 440 described above with reference to FIG. 9. As an example, the metal pattern 460 and the second sensor electrode 440 may be formed during the same process. In another embodiment, the metal pattern 460 may include the same or substantially the same material as that of the first sensor electrode 420 described above with reference to FIG. 9. As an example, the metal pattern 460 and the first sensor electrode 420 may be formed during the same process.

Figure 12:
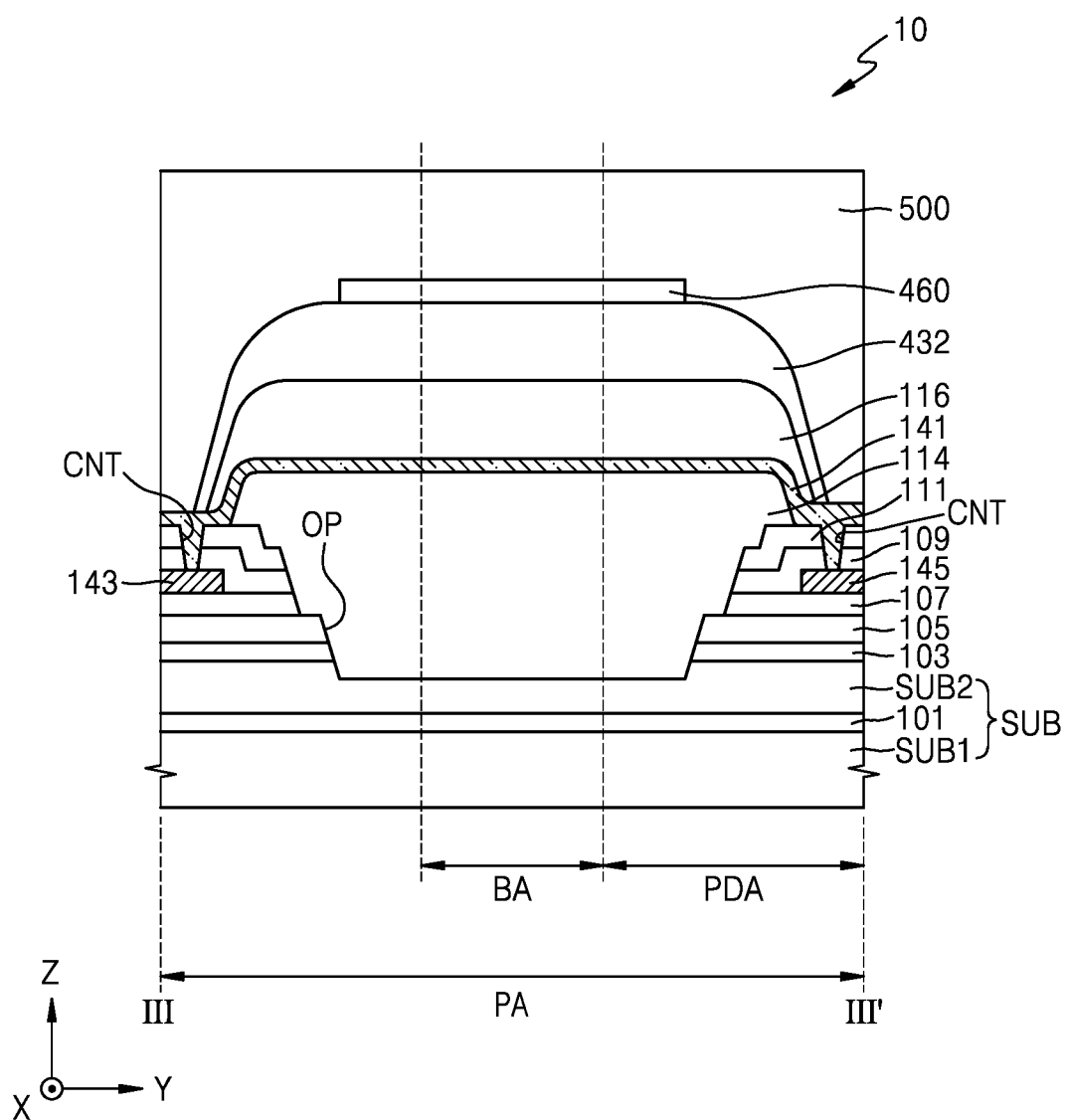
FIG. 12 is a cross-sectional view of a portion of a display apparatus according to an embodiment.

FIG. 12 is a cross-sectional view of a portion of the display apparatus 10 according to an embodiment. The embodiment of FIG. 12 is different from the embodiment of FIG. 11 in that a fourth organic insulating layer 432 is arranged on the second organic insulating layer 116 in FIG. 12 instead of the third organic insulating layer 182 in FIG. 11. In FIG. 12, the same reference symbols as those in FIG. 11 denote the same or substantially the same elements, and thus, redundant description thereof may not be repeated.

Referring to FIG. 12, the fourth organic insulating layer 432 may be arranged on the second organic insulating layer 116. As an example, the fourth organic insulating layer 432 may be directly arranged on the second organic insulating layer 116.

The fourth organic insulating layer 432 may include the same or substantially the same material as that of the second sensor insulating layer 430 described above with reference to FIG. 9. As an example, the fourth organic insulating layer 432 may be formed during the same process as a process of forming the second sensor insulating layer 430.

The metal pattern 460 may be arranged on the fourth organic insulating layer 432. The metal pattern 460 may be directly arranged on the fourth organic insulating layer 432.

Figure 13:
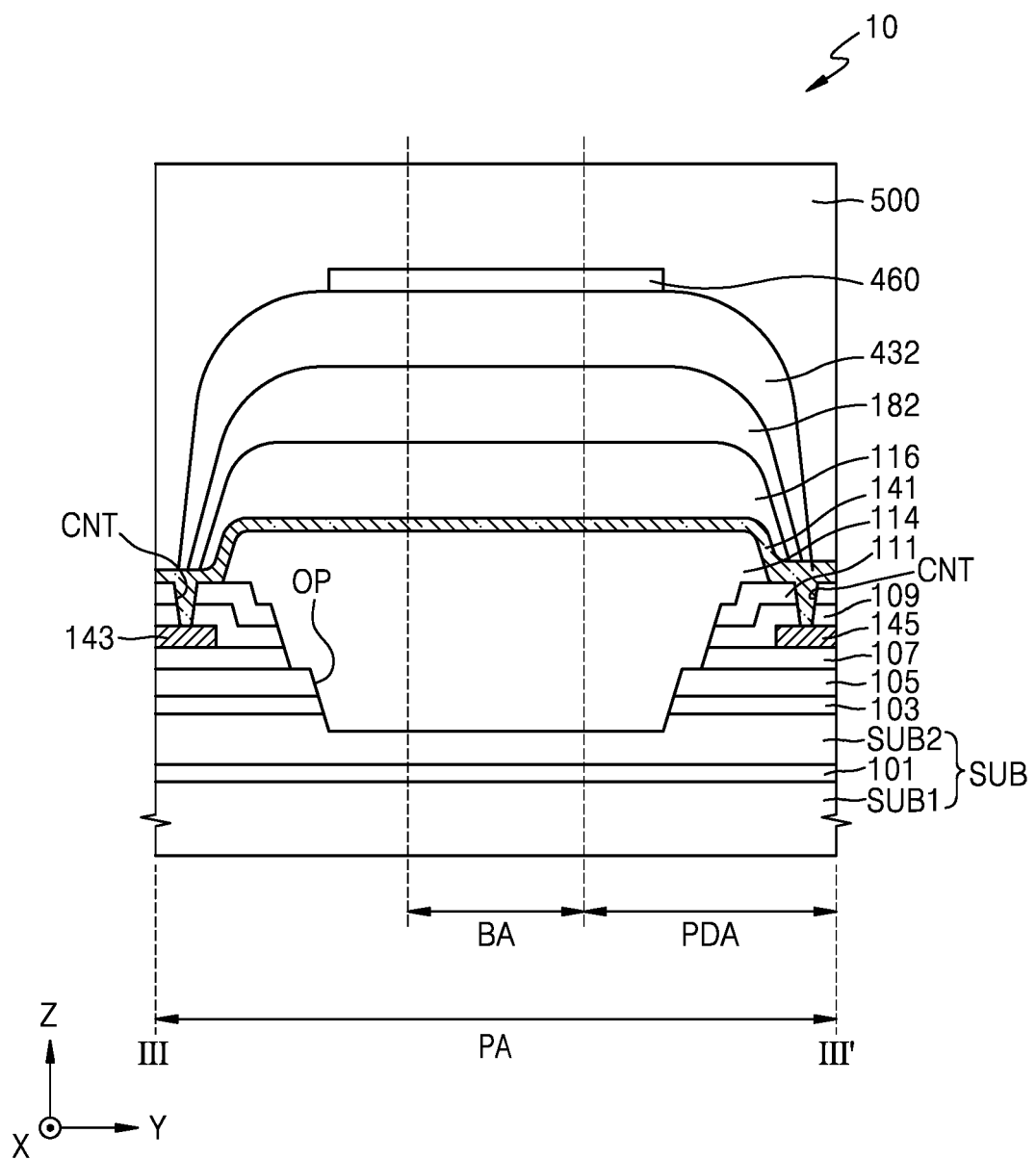
FIG. 13 is a cross-sectional view of a portion of a display apparatus according to an embodiment.

FIG. 13 is a cross-sectional view of a portion of the display apparatus 10 according to an embodiment. The embodiment of FIG. 13 is different from the embodiment of FIG. 11 in that a fourth organic insulating layer 432 is further arranged on the third organic insulating layer 182 in FIG. 13. In FIG. 13, the same reference symbols as those in FIG. 11 denote the same or substantially the same elements, and thus, redundant description thereof may not be repeated.

Referring to FIG. 13, the fourth organic insulating layer 432 is arranged on the third organic insulating layer 182. The fourth organic insulating layer 432 may be directly arranged on the third organic insulating layer 182. The fourth organic insulating layer 432 may include the same or substantially the same material as that of the second sensor insulating layer 430 described above with reference to FIG. 9. As an example, the fourth organic insulating layer 432 may be formed during the same process as a process of forming the second sensor insulating layer 430.

The metal pattern 460 may be arranged on the fourth organic insulating layer 432. The metal pattern 460 may be directly arranged on the fourth organic insulating layer 432.

Figure 14:
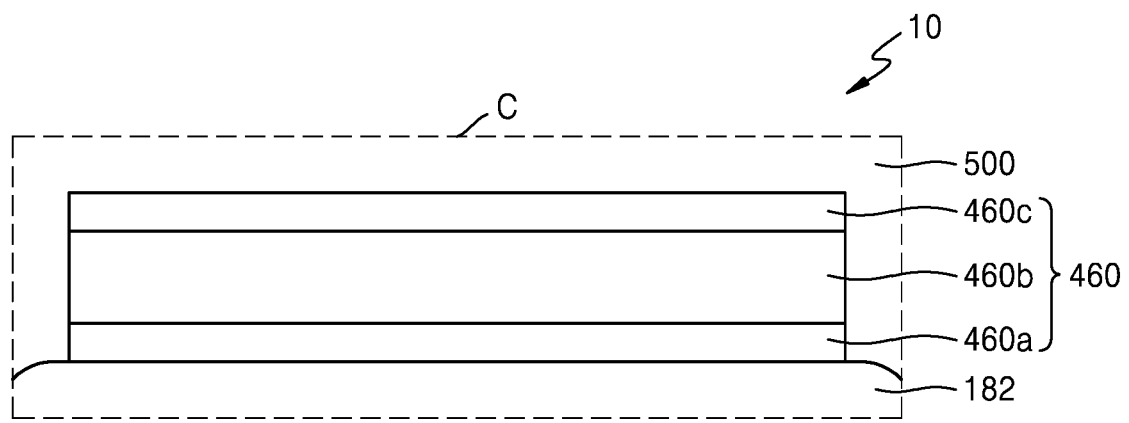
FIG. 14 is a cross-sectional view of a portion of a display apparatus according to an embodiment.

FIG. 14 is a cross-sectional view of a portion of the display apparatus 10 according to an embodiment. For example, FIG. 14 corresponds to an enlarged cross-sectional view of the region C of FIG. 11.

Referring to FIG. 14, the metal pattern 460 may include a first metal layer 460*a*, a second metal layer 460*b*, and a third metal layer 460*c*. The first metal layer 460*a* may be directly arranged on the third organic insulating layer 182. The second metal layer 460*b* may be arranged on the first metal layer 460*a*, and the third metal layer 460*c* may be arranged on the second metal layer 460*b*.

The first metal layer 460*a*, the second metal layer 460*b*, and the third metal layer 460*c* of the metal pattern 460 may include at least one of molybdenum (Mo), aluminum (Al), chrome (Cr), gold (Au), titanium (Ti), nickel (Ni), neodymium (Nd), and/or copper (Cu). The first metal layer 460*a* and the second metal layer 460*b* of the metal pattern 460 may include different materials from each other. In addition, the second metal layer 460*b* and the third metal layer 460*c* of the metal pattern 460 may include different materials from each other. As an example, the first metal layer 460*a* and the third metal layer 460*c* of the metal pattern 460 may include titanium (Ti), and the second metal layer 460b of the metal pattern 460 may include aluminum (Al).

Referring to FIGS. 11 to 14, a bending protecting layer (e.g., a bending protection layer) 500 may be arranged at (e.g., in or on) the bending area BA. For example, the bending protecting layer 500 may be arranged on the metal pattern 460 to cover the metal pattern 460. The bending protecting layer 500 is arranged at (e.g., in or on) the bending area BA to reduce stress applied to the first conductive line 141 while and/or when the display apparatus 10 is bent.

Figure 15:
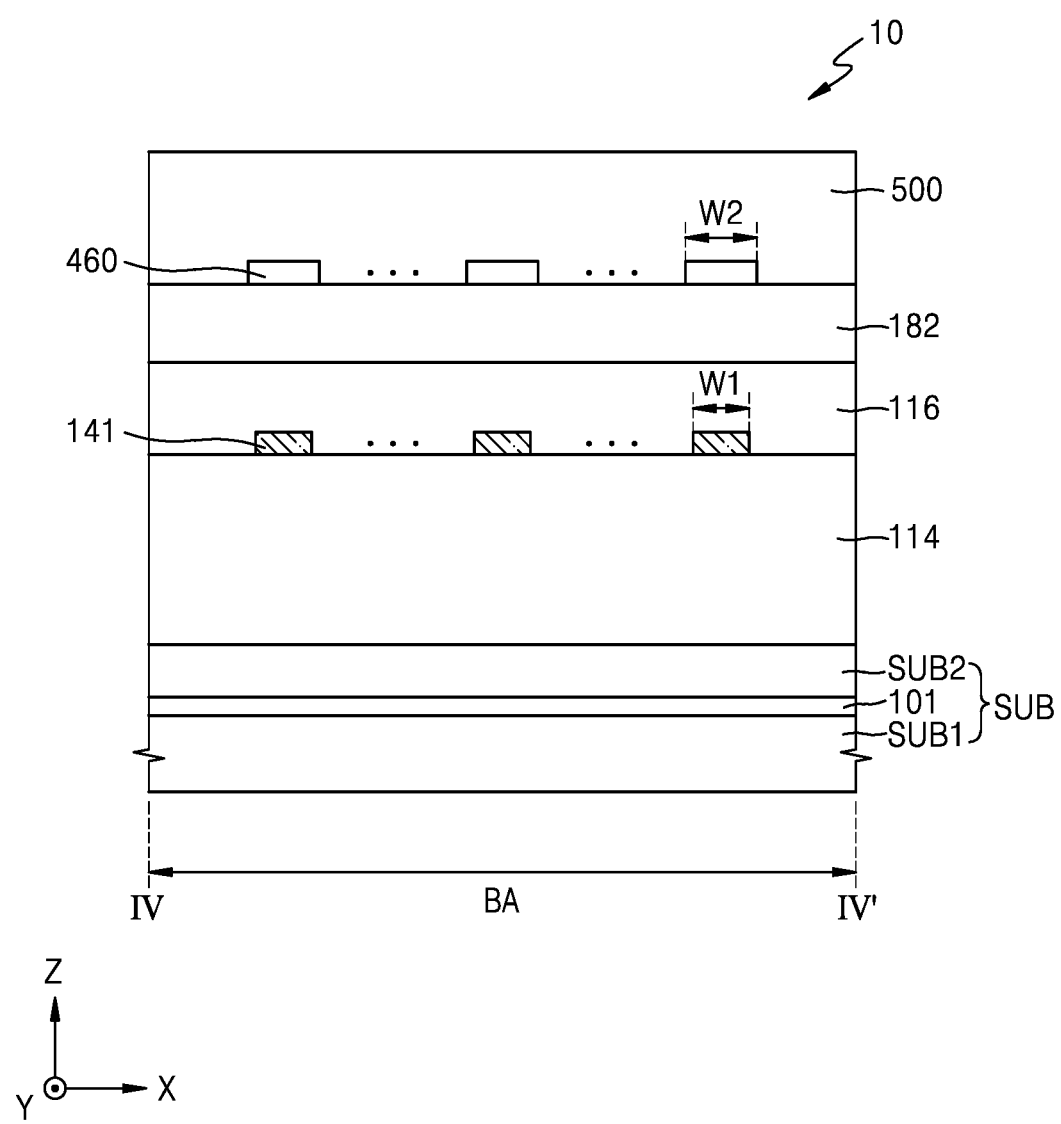
FIG. 15 is a cross-sectional view of a portion of a display apparatus according to an embodiment.

FIG. 15 is a cross-sectional view of a portion of the display apparatus 10 according to an embodiment. For example, FIG. 15 corresponds to a cross-sectional view of a portion of the display apparatus 10 taken along the line IV-IV' of FIG. 8.

Referring to FIG. 15, the substrate SUB may include the first substrate SUB1 and the second substrate SUB2. The first barrier layer 101 may be arranged between the first substrate SUB1 and the second substrate SUB2. The first organic insulating layer 114 may be arranged on the second substrate SUB2. The first conductive lines 141 may be arranged on the first organic insulating layer 114. The second organic insulating layer 116 may be arranged on the first conductive line 141 (e.g., to cover the first conductive line 141), and the third organic insulating layer 182 may be arranged on the second organic insulating layer 116. The metal patterns 460 may be arranged on the third organic insulating layer 182. For example, the metal patterns 460 may be arranged on the third organic insulating layer 182 to overlap with at least a portion of the first conductive lines 141, respectively.

The metal pattern 460 may be patterned to correspond to (e.g., to overlap with) the first conductive line 141. In the case where the first conductive line 141 has a first width W1, the metal pattern 460 arranged over the first conductive line 141 may have a second width W2 that is greater than or equal to the first width W1. Therefore, one metal pattern 460 may overlap with one of the first conductive lines 141. However, the present disclosure is not limited thereto, and one metal pattern 460 may overlap with two or three (or more) of the first conductive lines 141.

Figure 16:
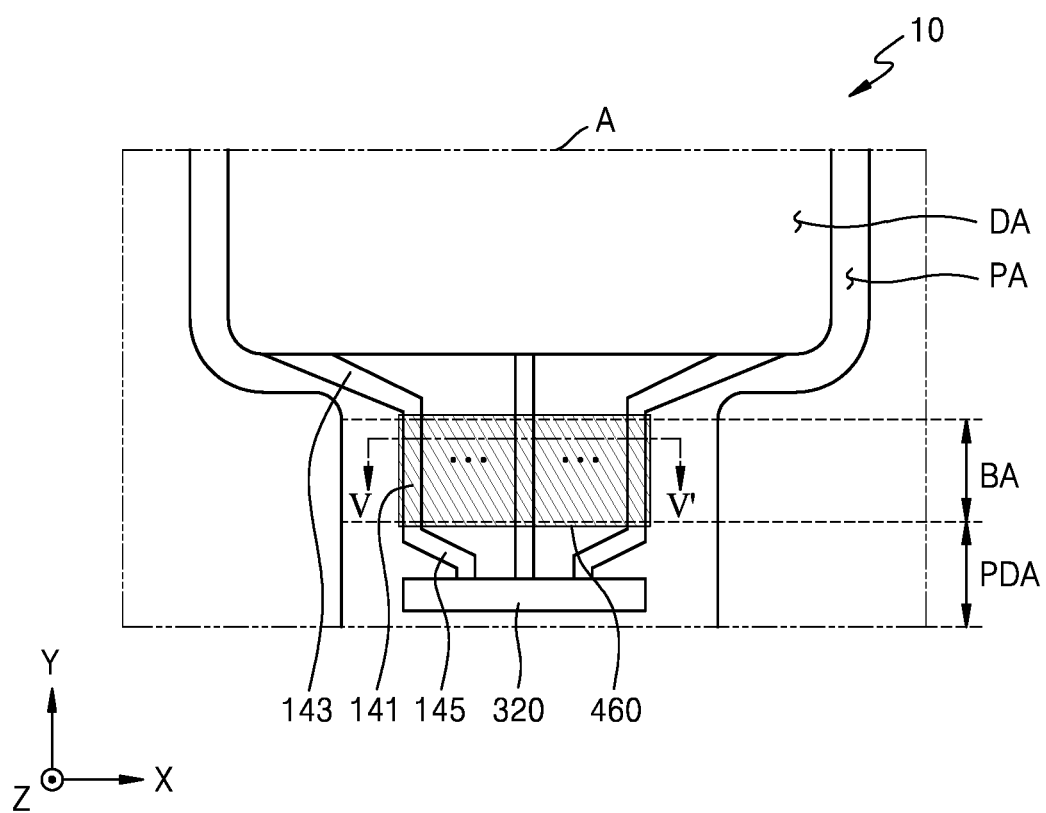
FIG. 16 is a cross-sectional view of a portion of a display apparatus according to an embodiment.
Figure 17:
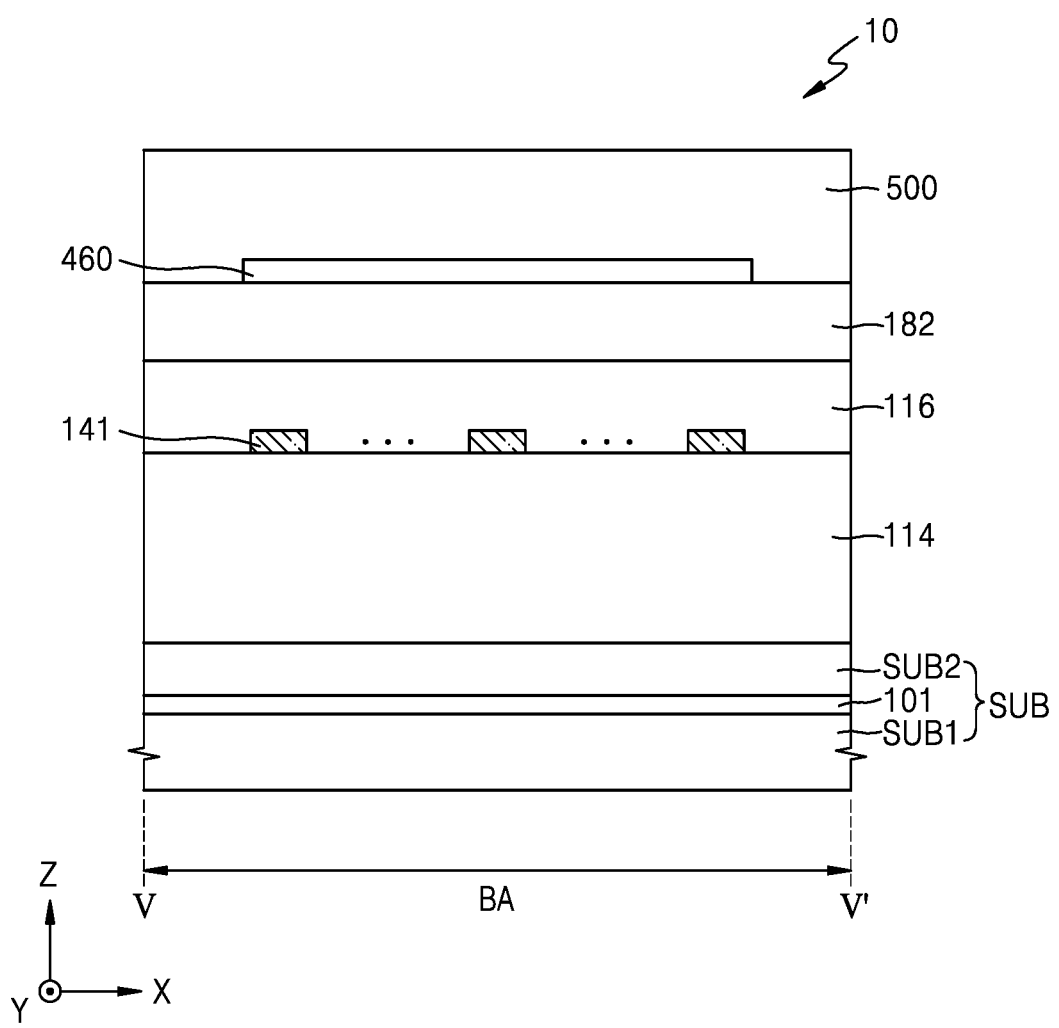
FIG. 17 is a cross-sectional view of a portion of a display apparatus according to an embodiment.

FIG. 16 is a cross-sectional view of a portion of the display apparatus 10 according to an embodiment, and FIG. 17 is a cross-sectional view of a portion of the display apparatus 10 according to an embodiment. For example, example, FIG. 17 is a cross-sectional view taken along the line V-V of FIG. 16. The embodiments of FIGS. 16 and 17 are different from the embodiments of FIGS. 8 and 15 in that the metal pattern 460 in FIGS. 16 and 17 is provided as one body to correspond to the bending area. In FIGS. 16 and 17, the same reference symbols as those of FIGS. 8 and 15 denote the same or substantially the same elements, and thus, redundant description thereof may not be repeated.

Referring to FIGS. 16 and 17, the first conductive line 141 and the metal pattern 460 may be arranged at (e.g., in or on) the bending area BA. The first conductive line 141 may be provided in a plurality, and the first conductive lines 141 may be spaced apart from each other and arranged at (e.g., in or on) the bending area BA. The metal pattern 460 may be arranged on the first conductive line 141. The metal pattern 460 may be provided as one body to correspond to the bending area BA. In other words, one metal pattern 460 may overlap with the plurality of first conductive lines 141 at the bending area BA.

FIGS. 18 to 25 are cross-sectional views showing a method of manufacturing a display apparatus according to an embodiment.

Hereinafter, a method of manufacturing a display apparatus is sequentially described with reference to FIGS. 18 to 25.

In brief overview, the method of manufacturing the display apparatus includes preparing the substrate SUB including the display area DA, the peripheral area PA, the pad area PDA, and the bending area BA, the peripheral area PA being outside the display area DA, the pad area PDA being inside the peripheral area PA, and the bending area BA being between the display area DA and the pad area PDA. Forming the connection electrode 139 at (e.g., in or on) the display area DA, and forming the first conductive line 141 at (e.g., in or on) the bending area BA. Forming the first sensor electrode 420 over the connection electrode 139, and forming a metal material layer 440M on the first sensor electrode 420 and the first conductive line 141. Patterning the metal material layer 440M to form the second sensor electrode 440 on the first sensor electrode 42, and to form the metal pattern 460 on the first conductive line 141.

Figure 18:
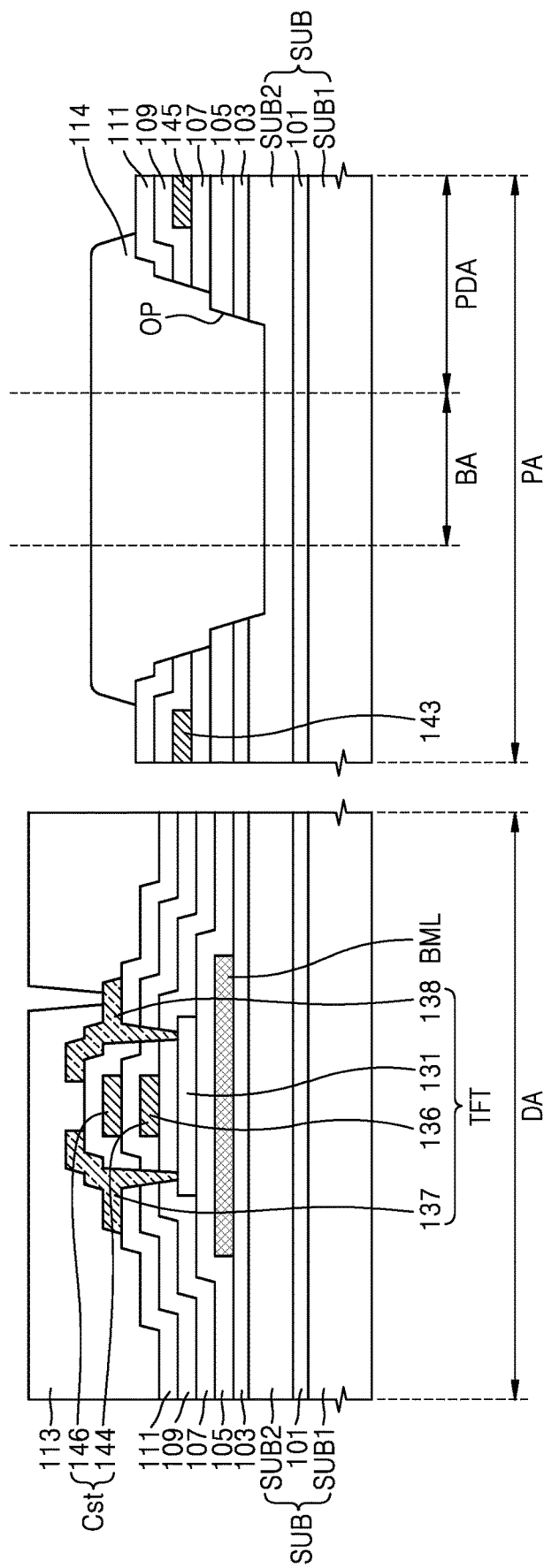
FIGS. 18-25 are cross-sectional views showing a method of manufacturing a display apparatus according to an embodiment.

In more detail, referring to FIG. 18, the bottom metal layer BML, the thin-film transistor TFT, and the storage capacitor Cst may be formed over the substrate SUB at (e.g., in or on) the display area DA. The thin-film transistor TFT may include the semiconductor layer 131, the gate electrode 136, the source electrode 137, and the drain electrode 138. The storage capacitor Cst may include the bottom electrode 144 and the top electrode 146.

The second conductive line 143 may be formed at (e.g., in or on) the peripheral area PA between the display area DA and the bending area BA. The third conductive line 145 may be formed at (e.g., in or on) the pad area PDA. The second conductive line 143 and the third conductive line 145 may include the same or substantially the same material as that of the gate electrode 136. As an example, the second conductive line 143 and the third conductive line 145 may be formed during the same process as a process of forming the gate electrode 136. A plurality of insulating layers may be arranged on the substrate SUB at (e.g., in or on) the peripheral area PA. The plurality of insulating layers arranged on the substrate SUB at (e.g., in or on) the peripheral area PA may include an opening OP corresponding to the bending area BA.

The planarization layer 113 may be formed on the third insulating layer 111 at (e.g., in or on) the display area DA, and the first organic insulating layer 114 may be formed inside the opening OP defined in the plurality of insulating layers at (e.g., in or on) the peripheral area PA. The first planarization layer 113 and the first organic insulating layer 114 may include the same or substantially the same material as each other. As an example, the first planarization layer 113 and the first organic insulating layer 114 may be formed during the same process.

Figure 19:
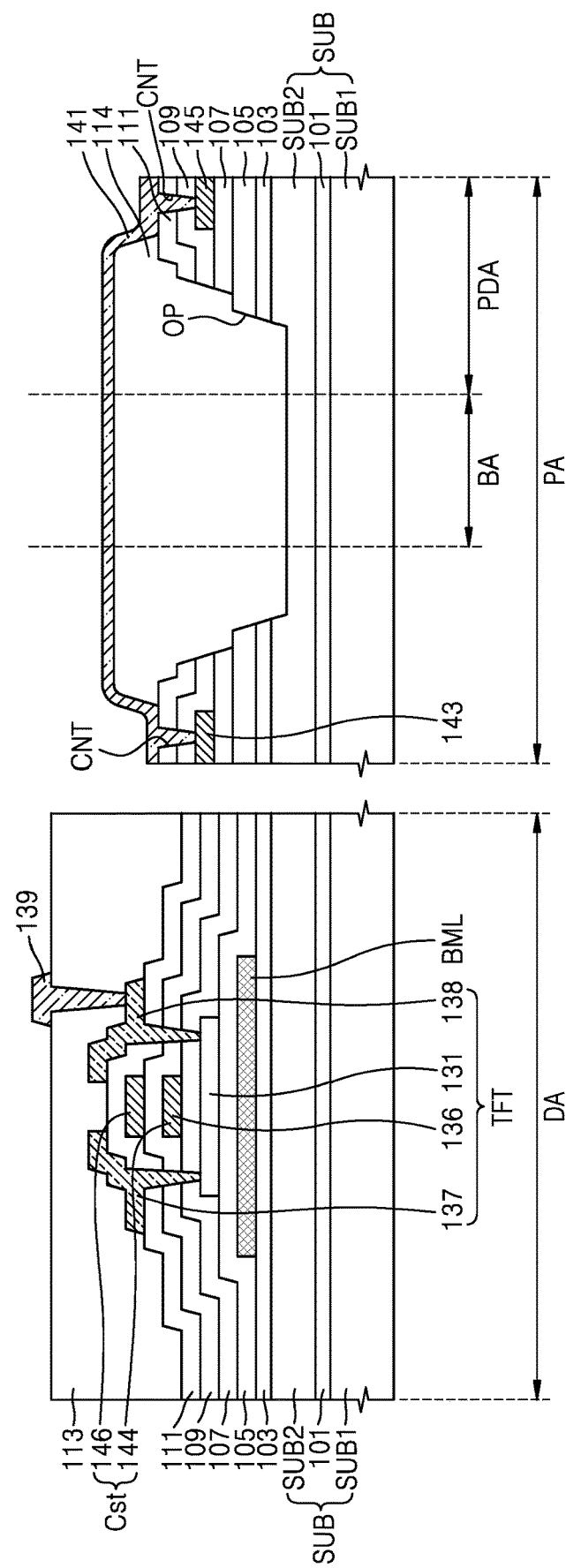

Referring to FIG. 19, the connection electrode 139 may be formed on the first planarization layer 113 at (e.g., in or on) the display area DA. The first conductive line 141 may be formed on the first organic insulating layer 114 at (e.g., in or on) the bending area BA. The connection electrode 139 and the first conductive line 141 may include the same or substantially the same material as each other. As an example, the connection electrode 139 and the first conductive line 141 may be formed during the same process.

The first conductive line 141 at (e.g., in or on) the bending area BA may extend to the peripheral area PA and the pad area PDA, the peripheral area PA being between the display area DA and the bending area BA. The first conductive line 141 that extends to the peripheral area PA may be electrically connected to the second conductive line 143 through a contact hole CNT. The first conductive line 141 that extends to the pad area PDA may be electrically connected to the third conductive line 145 through a contact hole CNT.

Figure 20:
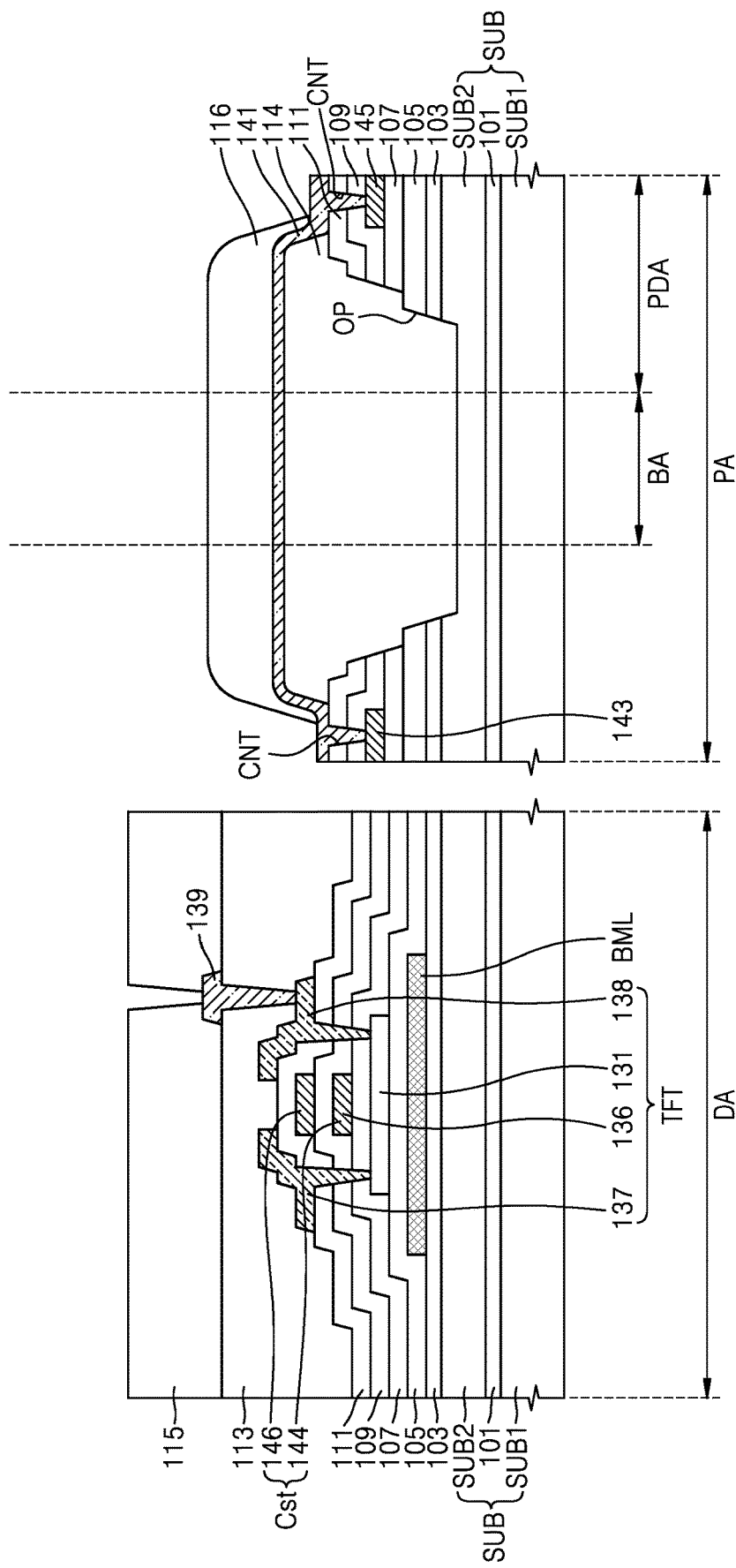

Referring to FIG. 20, the second planarization layer 115 may be formed on the connection electrode 139 at (e.g., in or on) the display area DA, and the second organic insulating layer 116 may be formed on the first conductive line 141 at (e.g., in or on) the bending area BA. The second planarization layer 115 and the second organic insulating layer 116 may include the same or substantially the same material as each other. As an example, the second planarization layer 115 and the second organic insulating layer 116 may be formed during the same process. At least a portion of the second organic insulating layer 116 may be also formed at (e.g., in or on) the peripheral area PA and the pad area PDA, the peripheral area PA being between the display area DA and the bending area BA.

Figure 21:
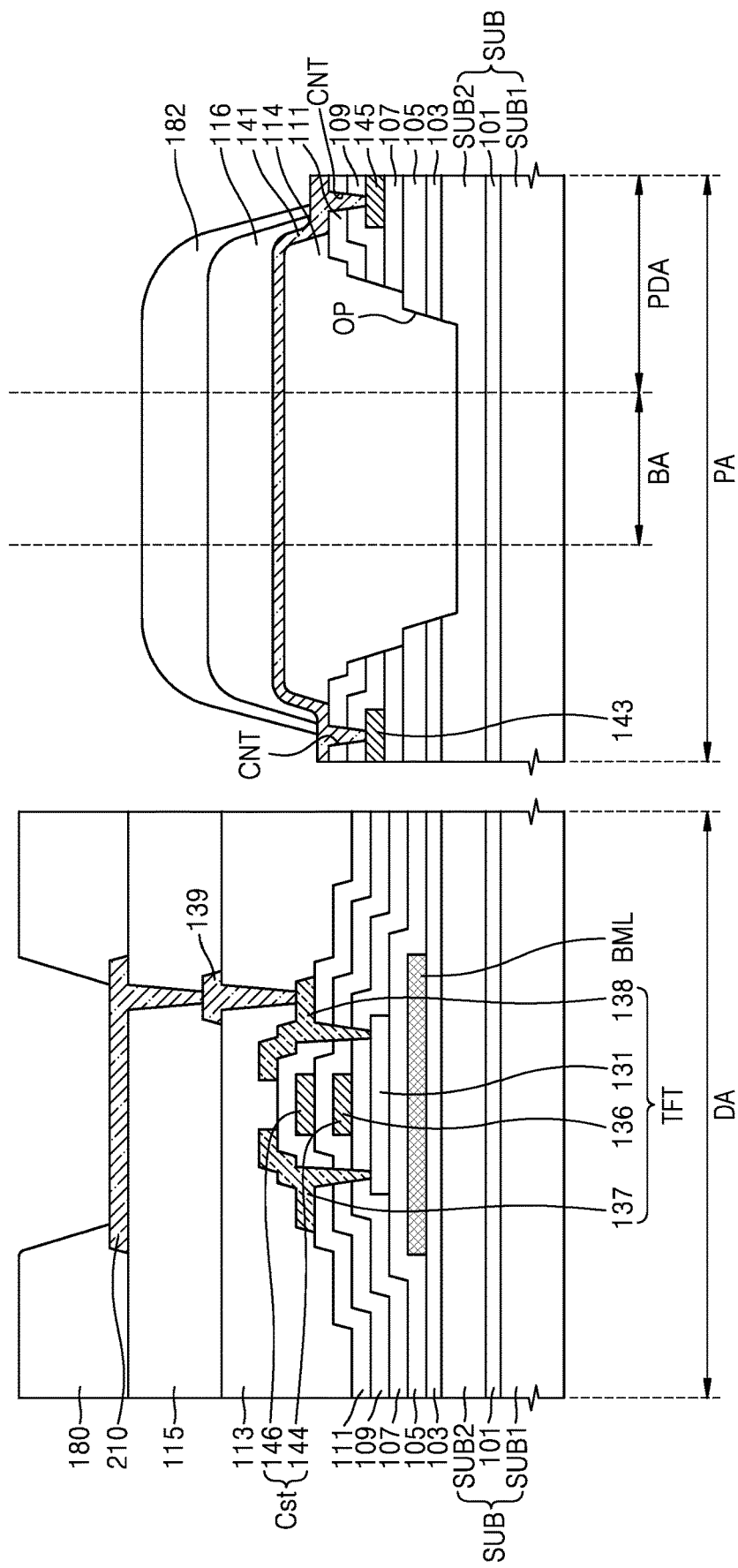

Referring to FIG. 21, the pixel electrode 210 and the pixel-defining layer 180 may be formed on the second planarization layer 115 at (e.g., in or on) the display area DA. The pixel-defining layer 180 may expose at least a portion of the pixel electrode 210. In addition, the third organic insulating layer 182 may be formed on the second organic insulating layer 116 at (e.g., in or on) the bending area BA. The pixel-defining layer 180 and the third organic insulating layer 182 may include the same or substantially the same material as each other. As an example, the pixel-defining layer 180 and the third organic insulating layer 182 may be formed during the same process.

At least a portion of the third organic insulating layer 182 may also be formed at (e.g., in or on) the peripheral area PA between the display area DA and the bending area BA, and at (e.g., in or on) the pad area PDA. The third organic insulating layer 182 may have a structure covering the lateral surfaces of the second organic insulating layer 116 thereunder.

Figure 22:
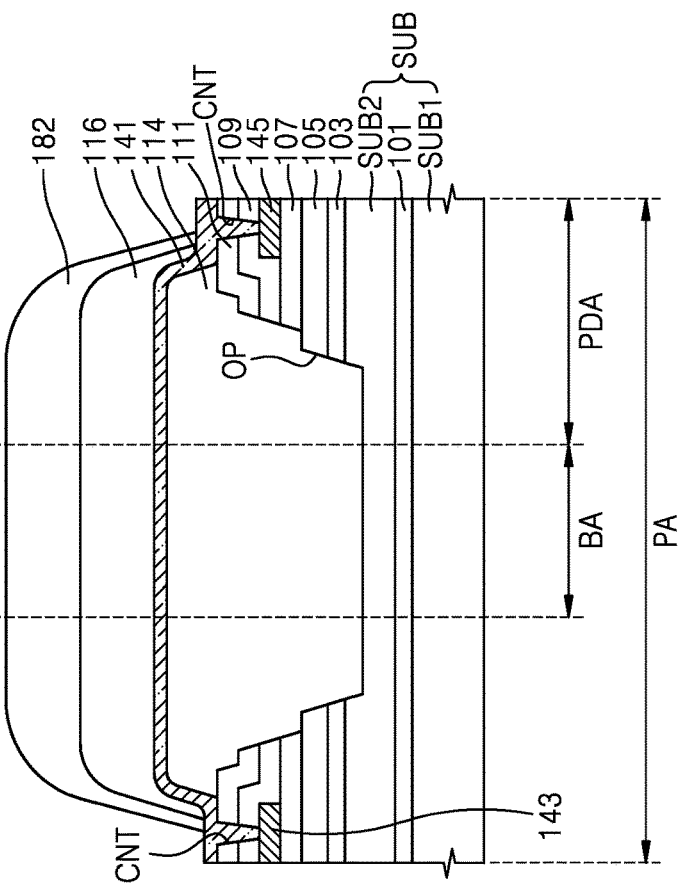
Figure 22:
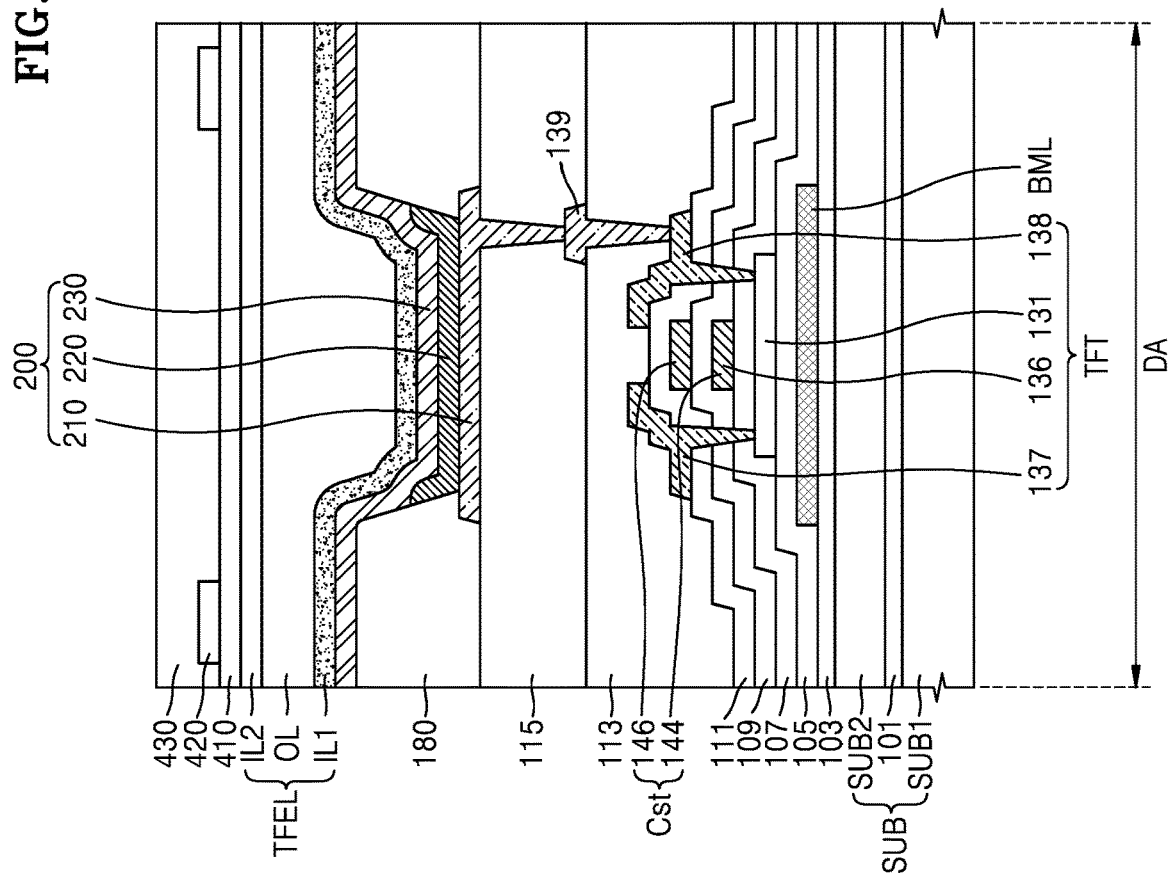

Referring to FIG. 22, the intermediate layer 220 may be formed on the portion of the pixel electrode 210 that is exposed through the pixel-defining layer 180 at (e.g., in or on) the display area DA. The opposite electrode 230 may be formed on the intermediate layer 220. The pixel electrode 210, the intermediate layer 220, and the opposite electrode 230 may constitute the display element 200. The encapsulation layer TFEL may be formed on the display element 200. The encapsulation layer TFEL may include the first inorganic encapsulation layer IL1, the organic encapsulation layer OL, and the second inorganic encapsulation layer IL2. The first inorganic encapsulation layer IL1 may be on the opposite electrode 230, the organic encapsulation layer OL may be on the first inorganic encapsulation layer IL1, and the second inorganic encapsulation layer IL2 may be on the organic encapsulation layer OL.

The first sensor insulating layer 410 and the second sensor insulating layer 430 may be formed on the encapsulation layer TFEL. The first sensor electrode 420 may be arranged between the first sensor insulating layer 410 and the second sensor insulating layer 430.

Figure 23:
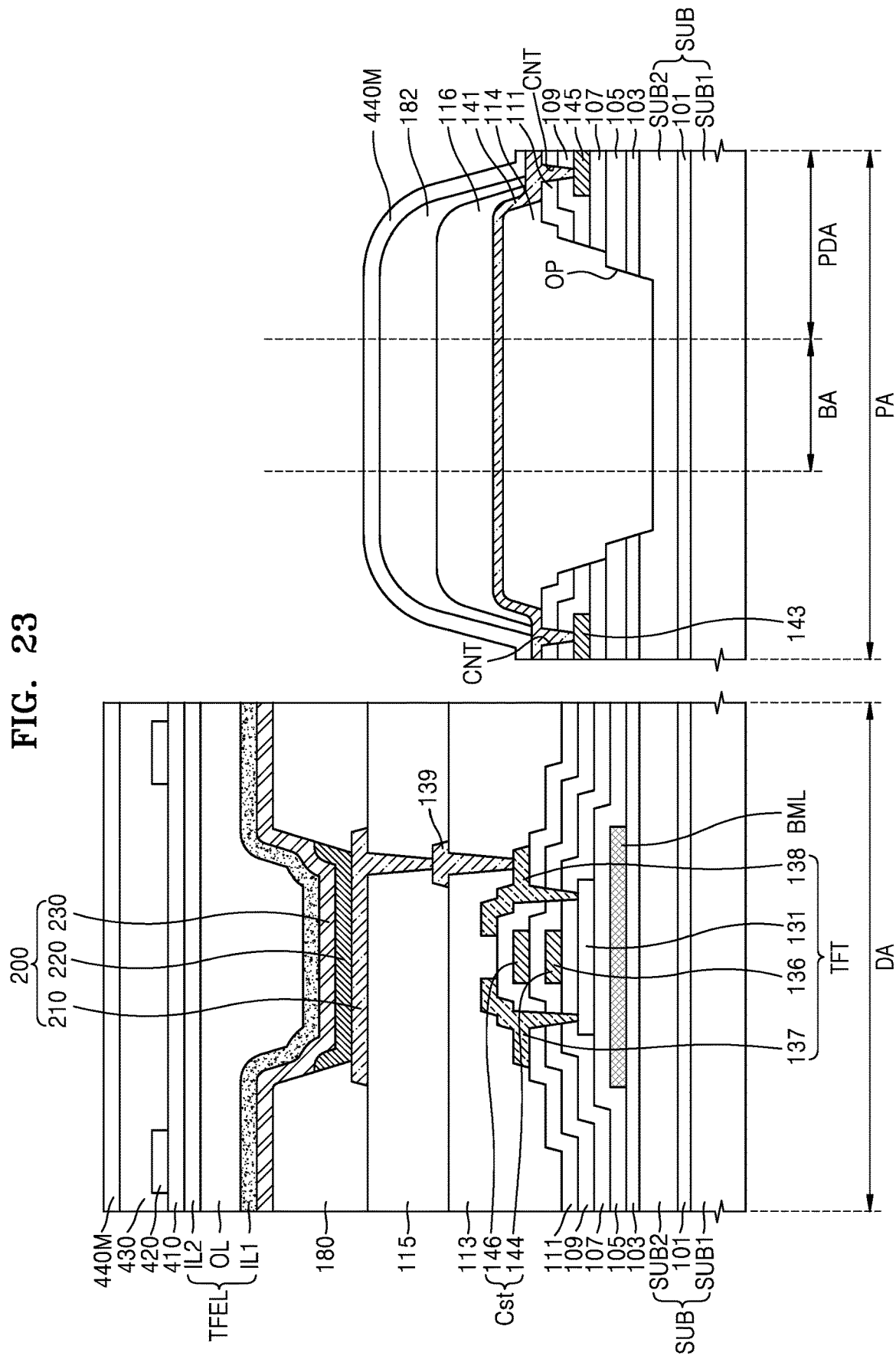

Referring to FIG. 23, the metal material layer 440M may be formed on the second sensor insulating layer 430 at (e.g., in or on) the display area DA, and on the third organic insulating layer 182 at (e.g., in or on) the bending area BA.

The metal material layer 440M may include at least one from among molybdenum (Mo), aluminum (Al), chrome (Cr), gold (Au), titanium (Ti), nickel (Ni), neodymium (Nd), and copper (Cu). As an example, the metal material layer 440M may include a plurality of metal materials. For example, the metal material layer 440M may have a multi-layered structure of titanium (Ti), aluminum (Al), and titanium (Ti).

At least a portion of the metal material layer 440M may also be formed at (e.g., in or on) the peripheral area PA between the display area DA and the bending area BA, and at (e.g., in or on) the pad area PDA.

Figure 24:
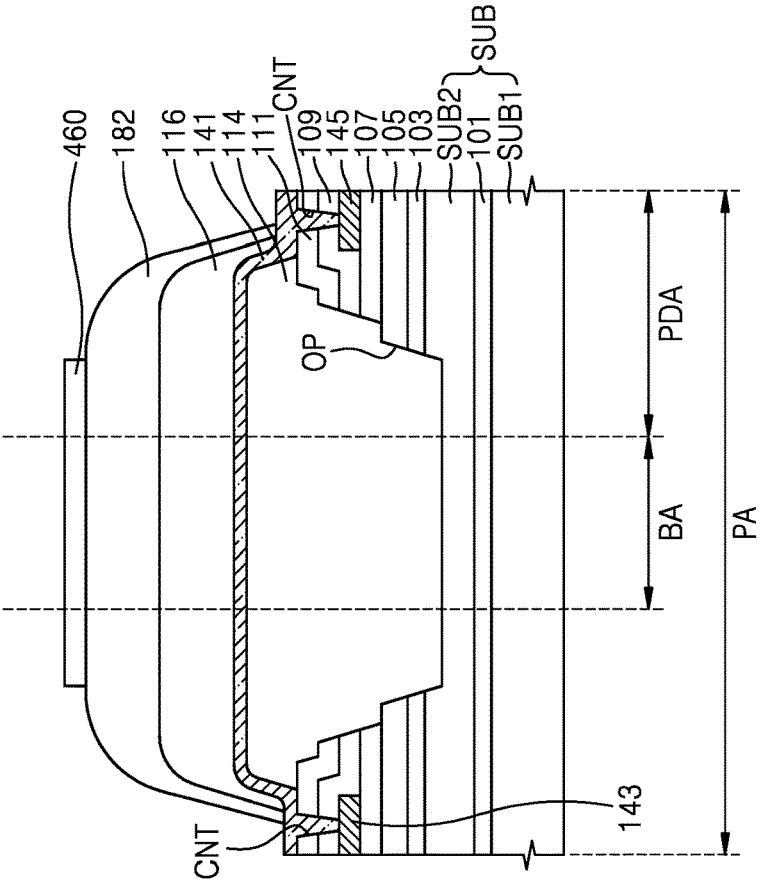
Figure 24:
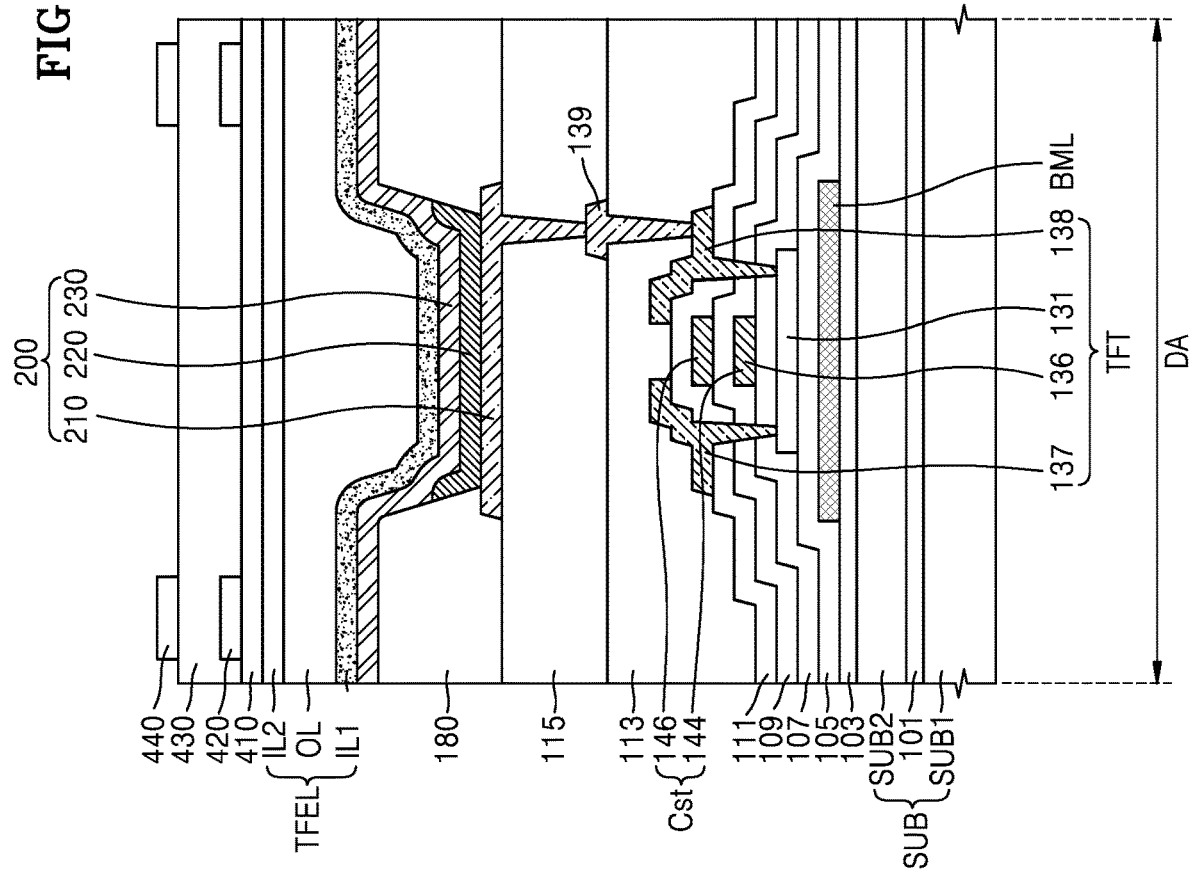

Referring to FIG. 24, the second sensor electrode 440 may be formed on the second sensor insulating layer 430, and the metal pattern 460 may be formed on the third organic insulating layer 182, by patterning the metal material layer 440M arranged on the second sensor insulating layer 430 and the third organic insulating layer 182.

Because the second sensor electrode 440 and the metal pattern 460 are formed by patterning the metal material layer 440M, the second sensor electrode 440 and the metal pattern 460 may include the same or substantially the same material as each other. As an example, the second sensor electrode 440 and the metal pattern 460 may be formed during the same process.

Although it is shown in FIG. 24 that the second sensor electrode 440 is formed on the second sensor insulating layer 430, and the metal pattern 460 is formed on the third organic insulating layer 182, by patterning the metal material layer 440M arranged on the second sensor insulating layer 430 and the third insulating layer 182, and thus, the second sensor electrode 440 and the metal pattern 460 include the same or substantially the same material as each other and are formed during the same process, the present disclosure is not limited thereto. For example, in some embodiments, the first sensor electrode 420 may be formed on the first sensor insulating layer 410, and the metal pattern 460 may be formed on the third organic insulating layer 182 by patterning a material constituting the first sensor electrode 420. In this case, the first sensor electrode 420 and the metal pattern 460 may include the same or substantially the same material as each other, and be formed during the same process.

As described above with reference to FIGS. 10 and 14, the second sensor electrode 440 may include the first layer 440a, the second layer 440b, and the third layer 440c. The first layer 440a may be on the second sensor insulating layer 430, the second layer 440b may be on the first layer 440a, and the third layer 440c may be on the second layer 440b. In addition, the metal pattern 460 may include the first metal layer 460a, the second metal layer 460b, and the third metal layer 460c. The first metal layer 460a may be on the third organic insulating layer 182, the second metal layer 460b may be on the first metal layer 460a, and the third metal layer 460c may be on the second metal layer 460b. Because the second sensor electrode 440 and the metal pattern 460 may be formed during the same process, the first layer 440a of the second sensor electrode 440 may correspond to the first metal layer 460a of the metal pattern 460, the second layer 440b of the second sensor electrode 440 may correspond to the second metal layer 460b of the metal pattern 460, and the third layer 440c of the second sensor electrode 440 may correspond to the third metal layer 460c of the metal pattern 460.

The metal pattern 460 at (e.g., in or on) the bending area BA may overlap with at least a portion of the first conductive line 141 therebelow.

Figure 25:
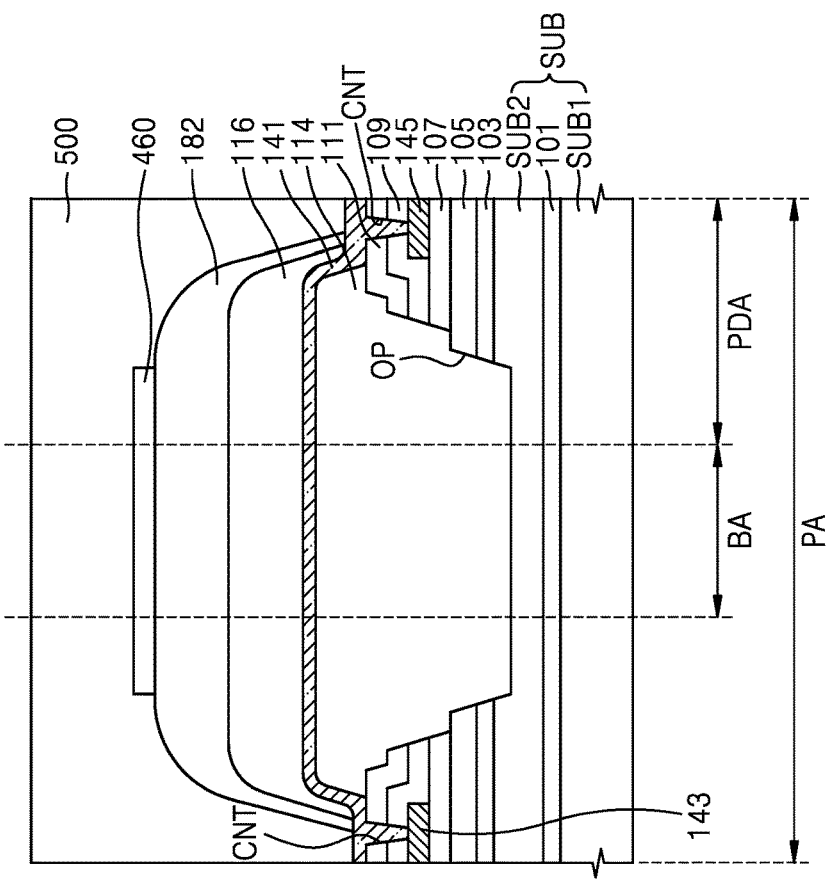
Figure 25:
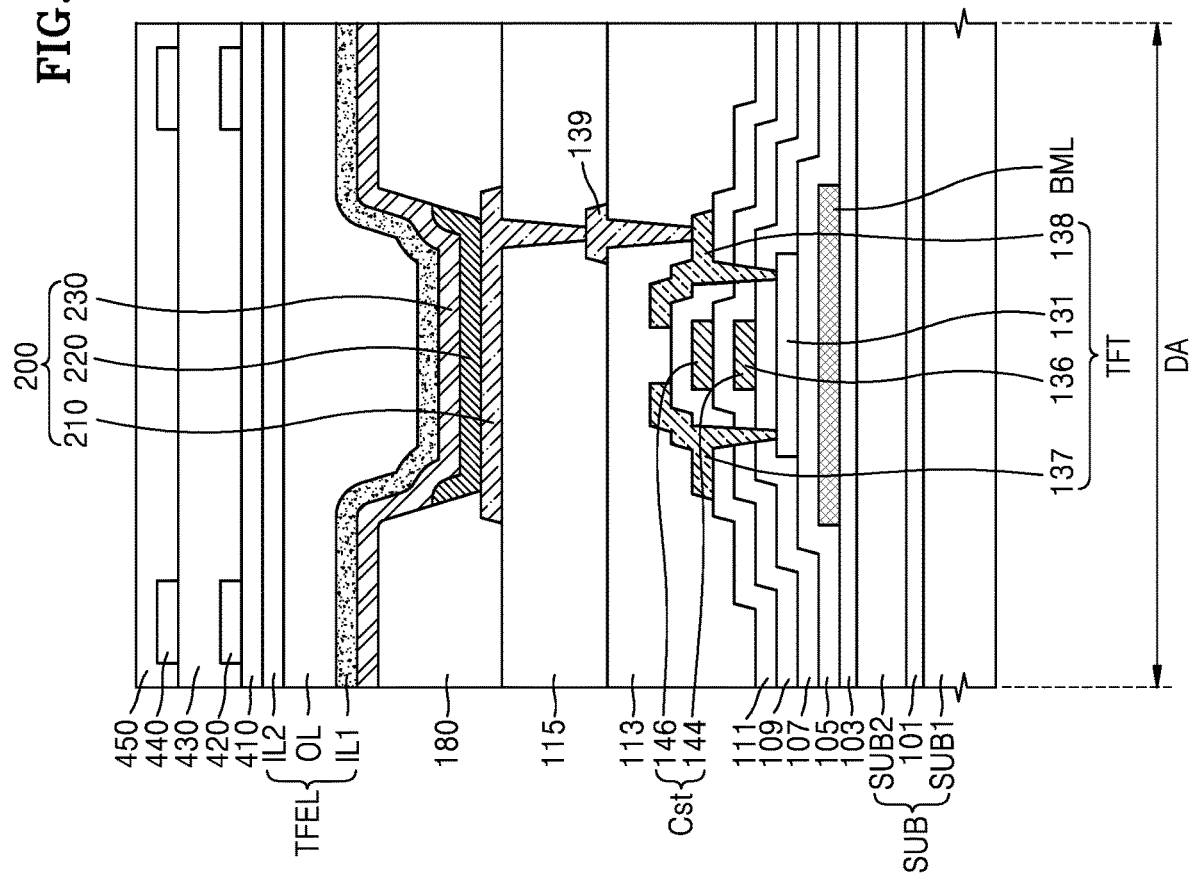

Referring to FIG. 25, the third sensor insulating layer 450 may be formed on the second sensor electrode 440 at (e.g., in or on) the display area DA, and the bending protecting layer 500 may be formed on the metal pattern 460 at (e.g., in or on) the bending area BA.

A metal (e.g. titanium (Ti)) constituting the sensor electrode is not removed and remains on the third organic insulating layer at (e.g., in or on) the bending area BA to form a metal oxide (e.g. $TiO_x$), and a crack may occur due to the metal oxide while bending is performed. The crack that occurs while bending is performed may be transferred to the first conductive line arranged at (e.g., in or on) the bending area, and may cause a disconnection of the first conductive line.

However, in the display apparatus according to the present embodiment, the metal pattern 460 is arranged on the third organic insulating layer 182 at (e.g., in or on) the bending area BA to prevent or reduce the occurrence of a crack while bending is performed, and thus, may prevent and reduce the disconnection of the first conductive line 141.

In an embodiment, because the metal pattern 460 on the third organic insulating layer 182 at (e.g., in or on) the bending area BA includes aluminum (Al), even though a metal oxide is formed on the third organic insulating layer 182 at (e.g., in or on) the bending area BA, the aluminum (Al) included in the metal pattern 460 may reduce stress that may occur while bending is performed, and accordingly, the occurrence of a crack while bending is performed may be prevented or reduced, and the disconnection of the first conductive line 141 may be prevented or reduced.

According to one or more example embodiments of the present disclosure, a display apparatus and a method of manufacturing the same may be provided, in which a defect occurrence rate may be reduced by reducing the occurrence of a crack. However, the spirt and scope of the present disclosure is not limited thereto.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
    a substrate comprising a display area, a peripheral area, a pad area, and a bending area, the peripheral area being outside the display area, the pad area being within the peripheral area, and the bending area being between the display area and the pad area;
    a first organic insulating layer at the bending area;
    a first conductive line on the first organic insulating layer;
    a second organic insulating layer on the first conductive line;
    a third organic insulating layer on the second organic insulating layer; and
    a metal pattern on the third organic insulating layer, and overlapping with at least a portion of the first conductive line,
    wherein the metal pattern is located at the bending area, and extends to overlap with at least a portion of the pad area, and
    wherein the metal pattern is electrically floated.

2. The display apparatus of claim 1, wherein the metal pattern is directly on the third organic insulating layer.

3. The display apparatus of claim 2, wherein the metal pattern comprises:
    a first metal layer on the third organic insulating layer; and
    a second metal layer on the first metal layer.

4. The display apparatus of claim 3, wherein the first metal layer comprises a material different from that of the second metal layer.

5. The display apparatus of claim 3, further comprising:
    a third metal layer on the second metal layer,
    wherein the second metal layer comprises a material different from that of the third metal layer.

6. The display apparatus of claim 1, further comprising:
    a bending protection layer on the metal pattern.

7. The display apparatus of claim 1, further comprising:
    a thin-film transistor at the display area; and
    a display element electrically connected to the thin-film transistor,
    wherein the thin-film transistor is electrically connected to the display element through a connection electrode.

8. The display apparatus of claim 7, wherein the connection electrode comprises the same material as that of the first conductive line.

9. The display apparatus of claim 7, further comprising:
    a second conductive line at the peripheral area; and
    a third conductive line at the pad area,
    wherein the first conductive line is electrically connected to the second conductive line and the third conductive line.

10. The display apparatus of claim 9, wherein the first conductive line is at a layer different from those of the second conductive line and the third conductive line.

11. The display apparatus of claim 9, wherein the second conductive line and the third conductive line each have a bent shape in a plan view.

12. The display apparatus of claim 11, wherein the first conductive line has a straight shape in a plan view.

13. The display apparatus of claim 9, wherein the thin-film transistor comprises:
    a gate electrode;
    a source electrode; and
    a drain electrode, and
    wherein the second conductive line and the third conductive line each comprises the same material as that of the gate electrode.

14. The display apparatus of claim 13, further comprising:
    a first planarization layer covering the source electrode and the drain electrode,
    wherein the first organic insulating layer comprises the same material as that of the first planarization layer.

15. The display apparatus of claim 14, further comprising:
    a second planarization layer on the first planarization layer,
    wherein the second organic insulating layer comprises the same material as that of the second planarization layer.

16. The display apparatus of claim 15, further comprising:
    a pixel electrode on the second planarization layer; and a pixel-defining layer exposing at least a portion of the pixel electrode, wherein the third organic insulating layer comprises the same material as that of the pixel-defining layer.

17. The display apparatus of claim 7, further comprising:
an encapsulation layer covering the display element; and
a sensor electrode layer on the encapsulation layer.

18. The display apparatus of claim 17, wherein the sensor electrode layer comprises:
a first sensor electrode; and
a second sensor electrode on the first sensor electrode, and
wherein the metal pattern comprises the same material as that of the second sensor electrode.

19. The display apparatus of claim 1, further comprising:
an insulating layer over the substrate,
wherein the insulating layer has an opening corresponding to the bending area.

20. The display apparatus of claim 19, wherein the first organic insulating layer is inside the opening.

* * * * *